(12) United States Patent
Jeganathan et al.

(10) Patent No.: US 7,704,762 B2
(45) Date of Patent: Apr. 27, 2010

(54) LAMP AND METHOD OF PRODUCING A LAMP

(75) Inventors: Balu Jeganathan, South Yarra (AU); John Albert Montagnat, East Ringwood (AU)

(73) Assignee: Lednium Technology PTY Limited, New South Wales (AU)

( * ) Notice: Subject to any disclaimer, the term of this patent is extended or adjusted under 35 U.S.C. 154(b) by 1272 days.

(21) Appl. No.: 10/487,040

(22) PCT Filed: Jun. 11, 2003

(86) PCT No.: PCT/AU03/00724

§ 371 (c)(1),
(2), (4) Date: Jul. 5, 2005

(87) PCT Pub. No.: WO03/107423

PCT Pub. Date: Dec. 24, 2003

(65) Prior Publication Data

US 2005/0285505 A1    Dec. 29, 2005

(30) Foreign Application Priority Data

| Jun. 14, 2002 | (AU) | ................................. PS 2979/02 |
| Aug. 14, 2002 | (AU) | ............................... 2002950814 |
| Mar. 12, 2003 | (AU) | ............................... 2003901114 |

(51) Int. Cl.
| H01L 21/00 | (2006.01) |
| H01L 29/201 | (2006.01) |
| H01L 23/495 | (2006.01) |
| H01L 23/48 | (2006.01) |
| H01L 23/52 | (2006.01) |
| H01L 29/40 | (2006.01) |
| H01L 33/00 | (2006.01) |
| H01J 61/94 | (2006.01) |
| H01J 1/62 | (2006.01) |
| H01J 63/04 | (2006.01) |
| F21V 7/10 | (2006.01) |
| F21V 1/00 | (2006.01) |
| F21V 11/00 | (2006.01) |
| F21V 7/00 | (2006.01) |
| F21V 21/00 | (2006.01) |
| F21V 7/04 | (2006.01) |
| F21S 4/00 | (2006.01) |

(52) U.S. Cl. .............................. 438/28; 257/90; 257/94; 257/98; 257/99; 257/100; 257/676; 257/784; 257/793; 257/E33.057; 257/E33.058; 257/E33.059; 257/E33.066; 438/29; 438/33; 438/35; 438/47; 438/956; 313/1; 313/500; 313/502; 313/512; 362/216; 362/238; 362/241; 362/247; 362/249.06; 362/249.14; 362/297; 362/296.04; 362/350; 362/612; 362/613; 362/633; 362/800

(58) Field of Classification Search ....................... None
See application file for complete search history.

(56) References Cited

U.S. PATENT DOCUMENTS 3,581,162 A    5/1971    Wheatley (Continued)

FOREIGN PATENT DOCUMENTS

DE    2361531    6/1974

(Continued)

OTHER PUBLICATIONS

PCT International Search Report, App. No. PCT/AU2003/00724, Date: Jun. 11, 2003.

(Continued)

*Primary Examiner*—Andy Huynh
*Assistant Examiner*—Hoang-Quan T Ho
(74) *Attorney, Agent, or Firm*—Knobbe, Martens, Olson & Bear, LLP

(57) ABSTRACT

A method of producing a lamp, including: mounting light emitting junctions in respective receptacles; mounting the receptacles on a curved support structure so as to form a three-dimensional array; and placing the light emitting junctions in electrical connection with the support structure.

65 Claims, 18 Drawing Sheets

U.S. PATENT DOCUMENTS

| | | | |
|---|---|---|---|
| 3,763,405 A | 10/1973 | Mitsuhata | |
| 3,875,456 A | 4/1975 | Kano et al. | |
| 3,875,473 A | 4/1975 | Lebailly | |
| 3,886,581 A | 5/1975 | Katsumura et al. | |
| 3,886,681 A | 6/1975 | Katsumura et al. | |
| 3,921,026 A | 11/1975 | Konishi et al. | |
| 3,942,185 A | 3/1976 | Lebailly | |
| 4,007,396 A | 2/1977 | Wisbey et al. | |
| 4,054,814 A | 10/1977 | Fegley et al. | |
| 4,173,035 A | 10/1979 | Hoyt | |
| 4,255,688 A | 3/1981 | Nagasawa | |
| 4,271,408 A | 6/1981 | Teshima et al. | |
| 4,467,193 A | 8/1984 | Carroll | |
| 4,473,834 A | 9/1984 | Soclof | |
| 4,703,219 A | 10/1987 | Mesquida | |
| 4,851,824 A | 7/1989 | Murata | |
| 4,878,107 A | 10/1989 | Hopper | |
| 4,893,223 A | 1/1990 | Arnold | |
| 4,935,665 A * | 6/1990 | Murata | 313/500 |
| 4,975,814 A | 12/1990 | Schairer | |
| 5,055,892 A | 10/1991 | Gardner et al. | |
| 5,083,192 A * | 1/1992 | Rzeznik et al. | 257/680 |
| 5,084,804 A | 1/1992 | Schairer | |
| 5,119,174 A | 6/1992 | Chen | |
| 5,218,233 A | 6/1993 | Takahashi | |
| 5,289,082 A | 2/1994 | Komoto | |
| 5,373,280 A | 12/1994 | Louy et al. | |
| 5,404,282 A | 4/1995 | Klinke et al. | |
| 5,455,199 A | 10/1995 | Sakamoto | |
| 5,515,253 A | 5/1996 | Sjobom | |
| 5,519,596 A | 5/1996 | Woolverton | |
| 5,534,718 A | 7/1996 | Chang | |
| 5,561,346 A | 10/1996 | Byrne | |
| 5,594,424 A | 1/1997 | Louy et al. | |
| 5,709,453 A | 1/1998 | Krent et al. | |
| 5,959,316 A | 9/1999 | Lowery | |
| 5,962,971 A | 10/1999 | Chen | |
| 5,998,925 A | 12/1999 | Shimizu | |
| 5,999,151 A | 12/1999 | Michael | |
| 6,068,383 A | 5/2000 | Robertson et al. | |
| 6,318,886 B1 * | 11/2001 | Stopa et al. | 362/555 |
| 6,331,063 B1 | 12/2001 | Kamada et al. | |
| 6,367,949 B1 | 4/2002 | Pederson | |
| 6,409,938 B1 | 6/2002 | Comanzo | |
| 6,412,971 B1 | 7/2002 | Wojnarowski et al. | |
| 6,521,916 B2 | 2/2003 | Roberts et al. | |
| 6,599,000 B2 | 7/2003 | Nolan | |
| 6,809,475 B2 | 10/2004 | Jeganathan et al. | |
| 6,961,190 B1 | 11/2005 | Tamaoki et al. | |
| 7,352,127 B2 * | 4/2008 | Jeganathan et al. | 313/512 |
| 2002/0006040 A1 | 1/2002 | Kamada et al. | |
| 2002/0042156 A1 | 4/2002 | Chen | |
| 2002/0084462 A1* | 7/2002 | Tamai et al. | 257/79 |
| 2002/0101157 A1 | 8/2002 | Suehiro | |
| 2002/0113244 A1 | 8/2002 | Barnett et al. | |
| 2002/0145384 A1* | 10/2002 | Jeganathan et al. | 313/512 |
| 2003/0107316 A1 | 6/2003 | Murakami et al. | |
| 2003/0151343 A1 | 8/2003 | Jeganathan et al. | |
| 2004/0120152 A1* | 6/2004 | Bolta et al. | 362/294 |
| 2005/0104515 A1 | 5/2005 | Jeganathan et al. | |

FOREIGN PATENT DOCUMENTS

| | | |
|---|---|---|
| DE | 34 38 154 A1 | 4/1986 |
| DE | 4107526 | 10/1991 |
| DE | 4124413 | 1/1993 |
| DE | 93 16 106.9 | 10/1993 |
| DE | G 93 16 106.9 | 3/1994 |
| DE | 200 07 730 U1 | 9/2000 |
| DE | 199 22 176 A1 | 11/2000 |
| DE | 200 13 605 U1 | 12/2000 |
| DE | 20110289 | 6/2001 |
| DE | 100 25 563 | 12/2001 |
| EP | 0107480 | 5/1984 |
| EP | 0303741 | 2/1989 |
| EP | 0354468 | 2/1990 |
| EP | 0364806 | 1/1993 |
| EP | 0921568 | 11/1998 |
| EP | 1098373 | 5/2001 |
| EP | 1 213 773 A1 | 6/2002 |
| FR | 2198675 | 3/1974 |
| FR | 2290721 | 6/1976 |
| FR | 25 18 317 A1 | 6/1983 |
| FR | 2588109 | 4/1987 |
| FR | 2 707 222 A1 | 1/1995 |
| FR | 2779508 | 12/1999 |
| GB | 2311126 | 9/1997 |
| GB | 2348324 | 9/2000 |
| GB | 2356037 | 5/2001 |
| GB | 2361581 A | 10/2001 |
| JP | 57156442 A2 | 9/1982 |
| JP | 61032483 | 2/1986 |
| JP | 61-141165 A | 6/1986 |
| JP | 11261114 | 11/1991 |
| JP | 06-222722 | 8/1994 |
| JP | 08162672 | 6/1996 |
| JP | 11163411 | 11/1997 |
| JP | 10200168 | 7/1998 |
| JP | 10-242523 | 9/1998 |
| JP | 10269822 | 10/1998 |
| JP | 11-026816 | 1/1999 |
| JP | 11162231 | 6/1999 |
| JP | 11162232 | 6/1999 |
| JP | 11163412 | 6/1999 |
| JP | 11177144 | 7/1999 |
| JP | 2000-252524 | 9/2000 |
| JP | 2002-245812 | 8/2002 |
| JP | 2002-336275 A | 11/2002 |
| JP | 2003-031005 A | 1/2003 |
| TW | 408497 | 10/2000 |
| WO | WO 97/12386 A2 | 4/1997 |
| WO | WO 0002261 | 1/2000 |
| WO | WO 0057490 | 9/2000 |
| WO | WO 01/08228 A1 | 2/2001 |
| WO | WO 0133640 | 5/2001 |
| WO | WO 0150540 | 7/2001 |
| WO | WO 01/97287 A1 * | 12/2001 |
| WO | WO 02/091489 | 11/2002 |
| WO | WO 02/103794 A1 * | 12/2002 |
| WO | WO 03/056636 | 7/2003 |
| WO | WO 03/107423 | 12/2003 |

OTHER PUBLICATIONS

PCT International Search Report, App. No. PCT/AU2004/000283, Date: Mar. 5, 2004.

Suppl. European Search Report, EP 01942891, Date: Aug. 2, 2006.

U.S. Appl. No. 10/305,294, filed Nov. 26, 2002, Jeganathan, et al.

U.S. Appl. No. 10/953,797, filed Sep. 29, 2004, Jeganathan, et al.

U.S. Appl. No. 10/548,498, filed Sep. 9, 2005, Jeganathan, et al.

Suppl. European Search Report, EP 03727013, Date: Sep. 13, 2006.

Derwent Abstract Accession No. 99-173233/15, JP 11026816A, (Citizen Denshi KK) Jan. 29, 1999.

Supplemental European Search Report, EP 02 72 9655, Date: Feb. 7, 2007.

PCT International Search Report, App. No. PCT/AU01/00717, App. Date: Jun. 15, 2001.

Jun. 24, 2003 Office Action fr U.S. Appl. No. 10/049,572 LED Lamp, filed Feb. 14, 2002.
Dec. 11, 2003 Office Action fr U.S. Appl. No. 10/049,572 LED Lamp, filed Feb. 14, 2002.
Jun. 8, 2004 Notice of Allowance fr U.S. Appl. No. 10/049,572 LED Lamp, filed Feb. 14, 2002.
Sep 22, 2004 Office Action fr U.S. Appl. No. 10/305,294 Method of Producing a Lamp, filed Nov. 26, 2002.
Mar. 22, 2005 Office Action fr U.S. Appl. No. 10/305,294 Method of Production a Lamp, filed Nov. 26, 2002.
Sep. 22, 2005 Office Action fr U.S. Appl. No. 10/305,294 Method of Producing a Lamp, filed Nov. 26, 2002.
Mar. 13, 2006 Office Action fr U.S. Appl. No. 10/305,294 Method of Producing a Lamp, filed Nov. 26, 2002.
Mar. 26, 2007 Office Action fr U.S. Appl. No. 10/305,294 Method of Producing a Lamp, filed Nov. 26, 2002.
U.S. Appl. No. 10/049,572, filed Oct. 10, 2002, Jeganathan, et al.
U.S. Appl. No. 10/305,294, filed Aug. 14, 2003, Jeganathan, et al.
U.S. Appl. No. 10/487,040, filed Dec. 29, 2005, Jeganathan, et al.
U.S. Appl. No. 10/548,498, filed Apr. 19, 2007, Jeganathan, et al.
Oct. 5, 2006 Notice of Allowance fr U.S. Appl. No. 10/305,294 Method of Producing a Lamp, filed Nov. 26, 2002.
Oct. 18, 2007 Notice of Allowance fr U.S. Appl. 10/305,294 Method of Producing a Lamp, filed Nov. 26, 2002.
Mar. 24, 2005 Office Action fr U.S. Appl. No. 10/953,797 LED Lamp With Light-Emitting Junctions Arranged in Three-Dimensional Array, filed Sep. 29, 2004.
Sep. 21, 2005 Office Action fr U.S. Appl. No. 10/953,797 LED Lamp With Light-Emitting Junctions Arranged in Three-Dimensional Array, filed Sep. 29, 2004.
Jun. 9, 2006 Office Action fr U.S. Appl. No. 10/953,797 LED Lamp With Light-Emitting Junctions Arranged in Three-Dimensional Array, filed Sep. 29, 2004.
Mar. 8, 2007 Office Action fr U.S. Appl. No. 10/953,797 LED Lamp With Light-Emitting Junctions Arranged in Three-Dimensional Array, filed Sep. 29, 2004.

* cited by examiner

STEP 620

STEP 605              STEP 610

STEP 645

STEP 615

STEP 650

STEP 655

LAMP AND METHOD OF PRODUCING A LAMP

This is a National Stage Entry of Application No. PCT/AU03/00724 filed Jun. 11, 2003; the disclosure of which is incorporated herein by reference.

FIELD OF THE INVENTION

The present invention relates to a method of manufacturing a lamp using pre-packaged light emitting semiconductors which are inserted into a lead frame and to a lamp produced thereby.

The present invention is an improvement on the subject matter of International patent Publication No. WO 02/103794, the entire disclosure and subject matter of which is incorporated herein by reference.

BACKGROUND OF THE INVENTION

Lighting applications involving the use of light emitting diodes (LEDs) are many and varied. Traditionally, it has been common to use a single LED as a small and discrete indicator, for example to indicate a status condition on a control panel for electrical plant.

It has also been known to provide a number of LEDs arranged in a two dimensional array so as to provide greater light capabilities than would be provided by a single LED. However, not all of these arrangements are suitable for providing quality domestic or industrial lighting.

It is an object of the invention to provide a lamp, and method of producing a lamp, which is an improvement over the prior art or which at least provides a useful alternative thereto.

SUMMARY

The present invention provides a method of producing a lamp, including:
mounting light emitting junctions in respective receptacles;
mounting the receptacles on a curved support structure so as to form a three-dimensional array; and
placing the light emitting junctions in electrical connection with the support structure.

The present invention further provides a lamp including:
a curved electrically conductive support structure;
a plurality of receptacles mounted on the support structure so as to form a three-dimensional array; and
a plurality of light emitting junctions disposed in respective receptacles and electrically connected to the support structure.

The present invention further provides a lead frame for receiving a plurality of light emitting junctions to form a lamp, including:
a curved, electrically conductive support structure;
a plurality of cavities in said support structure for receiving a respective plurality of receptacles having light emitting junctions disposed therein, such that said light emitting junctions form a three-dimensional array.

In accordance with a preferred embodiment of the present invention, there is provided a method of producing a three dimensional array of light emitting junctions on a supporting structure. This method provides a considerable simplification of the manufacturing process disclosed in prior art, and suggests itself potentially as the likely successor to methods of mounting light emitting junctions, that are in use today.

Preferably the method provides that light emitting junctions are attached into a one-dimensional or two-dimensional array of preformed metallic, or other material, electrically conductive cups or other receptacles.

Preferably the cups in the linear array, with light emitting junctions attached, are subsequently singularised.

Preferably the singular cups are unsymmetrical in configuration to allow correct orientation, with respect to electrical polarity, of the light emitting junction within each cup and the orientation of each cup within the three dimensional array.

Preferably the singular cups are placed in a series of mating holes to a pre-determined pattern, within a curved portion of a lead frame with a part spherical surface.

Preferably the profile of the cups is designed to produce a specific pattern of light from each light emitting junction, such that the combined light pattern from a three dimensional array of cups on a lead frame is predictable and repeatable in mass production.

Preferably the array of cups so placed in the lead frame are restrained in their respective holes by welding, soldering, glueing or by other means which ensures the continuity of mechanical, thermal and electrical properties between the lead frame and the cups.

Preferably the cups are installed on electrical conductors within the lead frame which are used to control the flow of electric current and consequently the luminous output of the light emitting junctions.

Preferably the light emitting junctions are electrically connected to two conductors within the lead frame by means of intermediate conductors. The arrangement of connections of the intermediate conductors may be configured to allow the light emitting junctions to be controlled individually or in groups.

In another embodiment the cups in the array, each fitted with a light emitting junction, are singularised from the array and packaged on tape and reel, or other commonly used packaging system. Such packaging provides scope for applications, other than a three dimensional array on a lead frame, where modular mounting of light emitting junctions is desirable.

In another aspect, there is provided a lamp, formed in accordance with the above-described method.

In yet another aspect, there is provided a cup for receiving a light emitting junction, with side walls arranged to direct light which is output from the junction, the cup further serving to dissipate heat generated from the junction, which is thermally coupled thereto.

BRIEF DESCRIPTION OF THE DRAWINGS

The invention is described, by way of non-limiting example only, with reference to the accompanying drawings, in which.

DETAILED DESCRIPTION

Figure 1A:
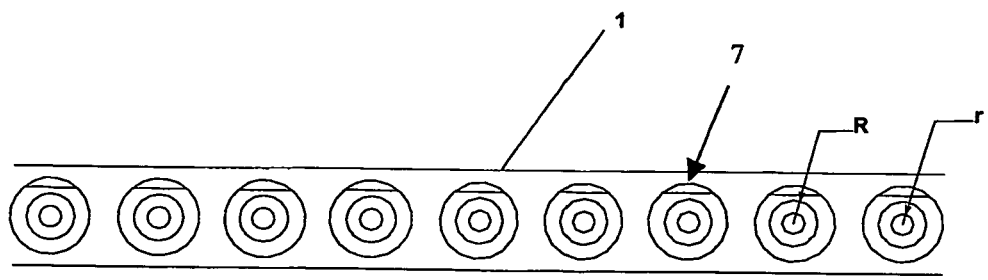
FIGS. 1A, 1B and C show plan, cross-sectional side and perspective views of a linear array of cups.

Like reference indicators are used to indicate like or similar features in the drawings.

Figure 3A:
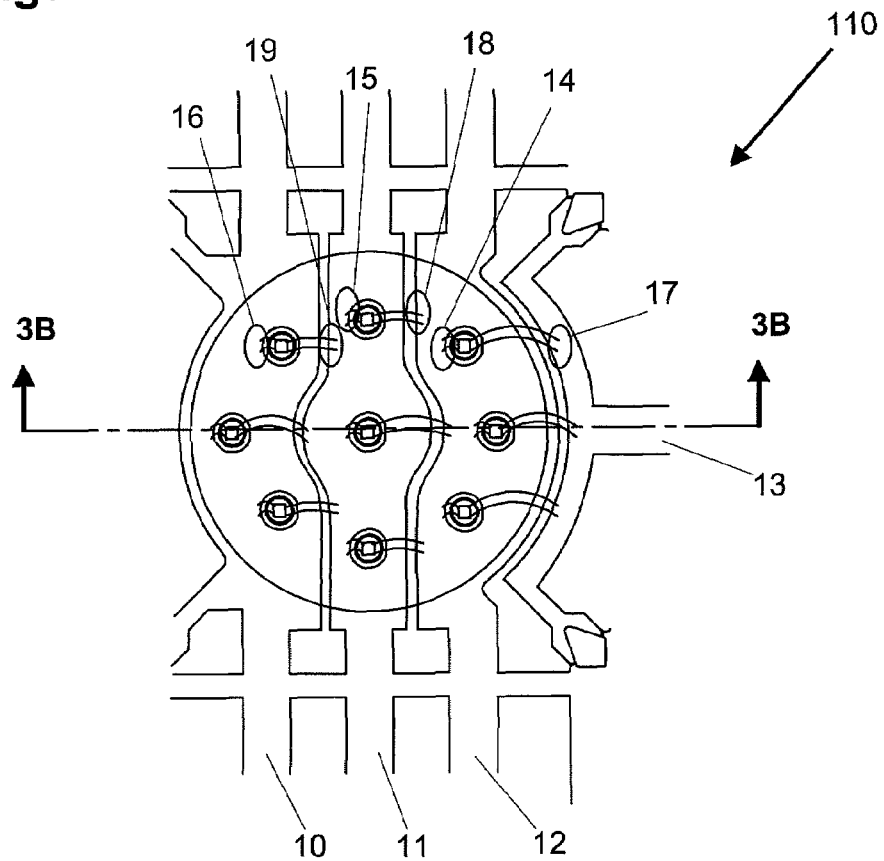
FIGS. 3A and 3B are plan and side cross-sectional views of a lead frame fitted with cups and intermediate conductors;.
Figure 3B:
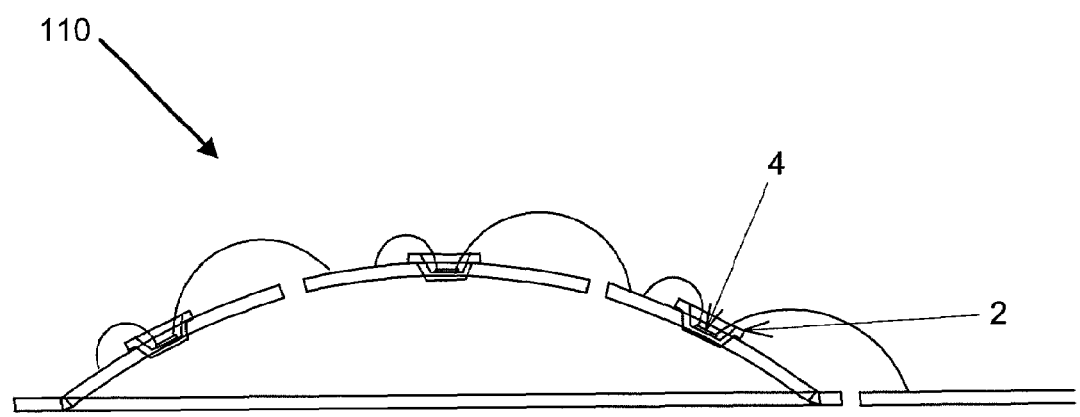

Referring initially to FIGS. 3A and 3B, preferred embodiments of the invention relate to a lamp and a method of producing a lamp having a plurality of light emitting junctions 4 mounted on a lead frame 110 having curved conductors 10, 11 and 12. The junctions 4 are located in respective receptacles 2 which are mounted onto the lead frame 110 and subsequently electrical connections are formed between the junctions 4 and the curved conductors, 10, 11, 12 and 13 (being the supply conductor) to enable an electrical circuit to be completed via each of the junctions 4 when the lamp is turned on. Conductors 10, 11 and 12 are three-dimensionally curved (for example, spherically) but supply conductor 13 is only two-dimensionally curved (i.e. planar but curved).

The receptacles 2 are formed separately to lead frame 110 and the junctions 4 are mounted therein prior to the receptacles 2 being mounted on the lead frame 110. The receptacles 2 are preferably formed in bulk from a strip or sheet material and then separated from that material either before or after the junctions 4 are mounted in the receptacles 2.

Figure 1B:
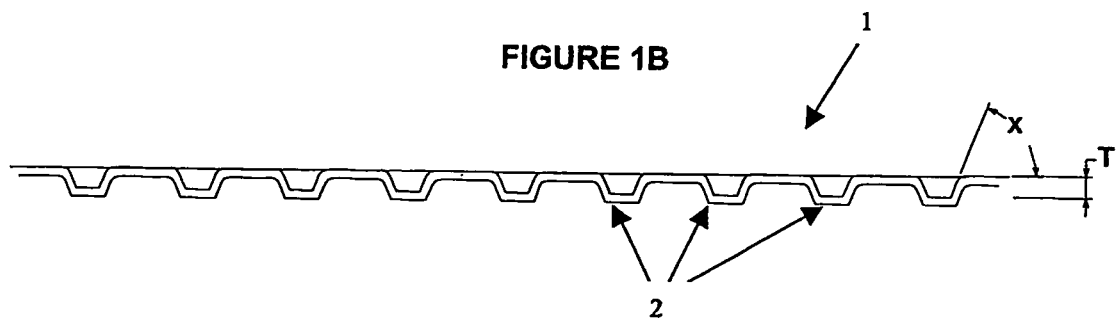
Figure 1C:
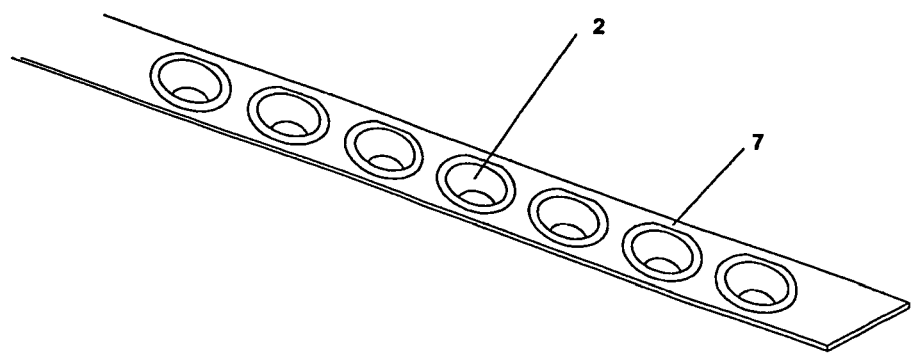

A linear array 1 of receptacles 2 (formed preferably as generally concave cups), as shown in FIGS. 1A, 1B and 1C, is preferably formed from thin sheet metal, copper or the like, by conventional means, such as pressing or stamping. Other forms of receptacles may be appropriate but all such receptacles are referred to herein as cups for the sake of simplicity. A cup 2 having a junction 4 disposed or affixed therein is referred to herein as a cup assembly 3, for convenience. Instead of a linear (one-dimensional) array, the cups may be formed in a two-dimensional sheet array.

One advantageous aspect of the preferred cup is its shape, which allows each cup to function as an optical guide for controlling the direction of light output from the junction mounted therein. Each cup 2 is preferably of a generally circular form when seen in plan view, as shown in FIG. 1A, although other forms, such as elliptical or more rectangular forms, may function suitably. The preferred cup form has a circular inner base of radius r, from which cup walls of a generally frustoconical shape diverge at an angle X (relative to horizontals as shown in FIG. 1B) toward a lip of the cup, having outer radius R. The vertical depth from the lip of the cup to the inner circular base surface of the cup is shown by reference T in FIG. 1B.

Figure 2A:
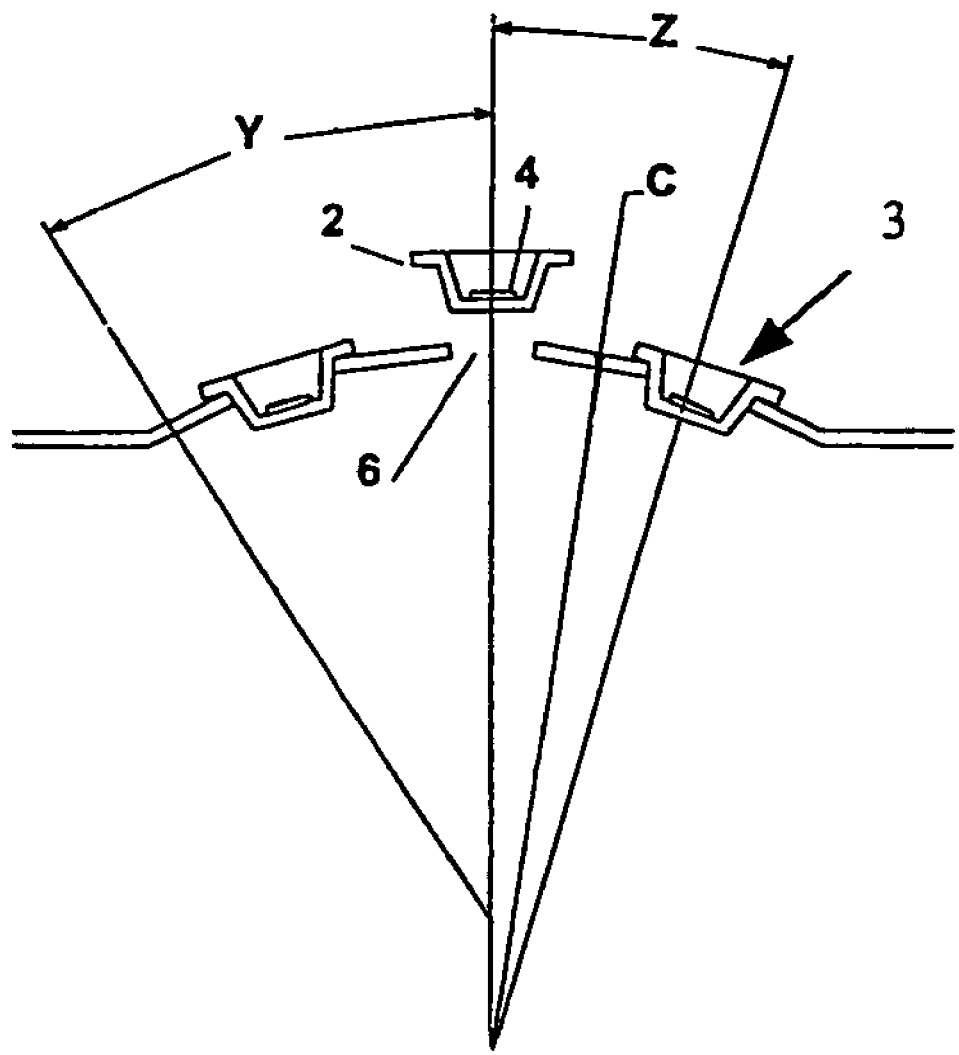
FIG. 2A is a cross-sectional side view of a lead frame of convex form illustrating cup insertion.

As shown in FIG. 2A, the cup assemblies 3 are mounted in the lead frame so that their angular orientation is displaced with respect to one another (based on the lead frame 80 having a part spherical shape in the area where the cups 2 are mounted thereon). This angular displacement is designated by reference Z in FIG. 2.

The shape of the cups 2, and dimensions of radii R and r, side (displacement) angle Z and depth T, are preferably determined by their respective influence on the light pattern which emerges from the cup. It is preferred that the luminous intensity emanating from the lamp be optimised for linearity within the overall angle of incidence, 2 times angle Y (shown in FIG. 2A), of the beam from the lamp. The solid angle subtended by the beam, 2×Y is traditionally referred to as the 'half angle'. It is defined as 'the angle within which the luminous intensity exceeds 50% of the maximum value of the beam'. This is a significant factor in the optical performance of the lamp because it affects the effectiveness of the illumination provided by a lamp of this nature.

The influence of these factors, R, r, T and angle X, together with the radius of curvature C of the lead frame, and the displacement angle Z, of each cup within the part spherical portion of the lead frame, constitute the parameters which determine the value of angle Y and therefore the nature of the output illumination pattern of the assembled lamp.

These factors are variables in each lamp design and a variety of lamps can be designed by optimising these variables with respect to the preferred half angle, the number of cups installed in the lamp, and the relative positions of the cups. For further lamp design examples, please refer to FIGS. 15 and 17.

After formation, the array of cups is preferably plated selectively, with silver, silver alloy or similar material. The plating is to enhance the optical performance of each cup by providing a highly reflective surface, and in addition may simplify the attachment process (eg. soldering or applying silver adhesive) employed to restrain the cups 2 in holes 6 (shown in FIG. 2A) in the lead frame.

Subsequent to formation and plating of the linear array of cups, a light emitting junction (die) 4 is attached to the bottom inner surface of each cup to form a cup assembly 3. (Throughout the specification, reference to a "die" is used interchangeably with "junction" and "LED".) Due precautions are required to align each die consistently with the linear array. The cups are preferably singularised from the array, by conventional means, and the polarity indicated by notching, stamping (or some other method) a mark 7 on one side of the cup 2. In one preferred form, the mark 7 is a truncation or flattening of one outer edge of the cup. The formation of the mark 7 on the cups may be performed immediately after the cups are formed and before plating so as to assist in aligning the junctions consistently with respect to polarity.

Figure 2B:
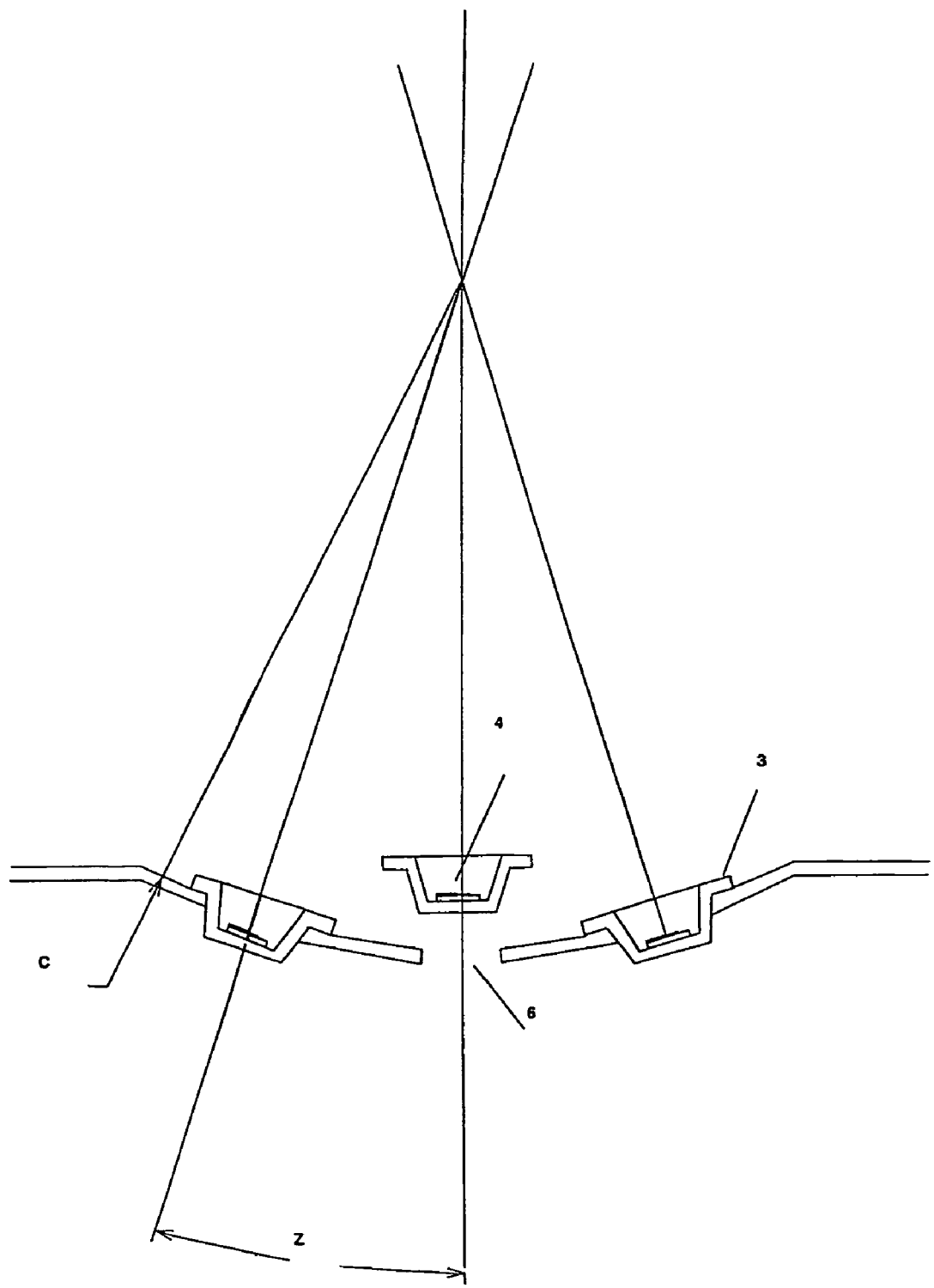
FIG. 2B is a cross-sectional side view of a lead frame of concave form illustrating cup insertion.
Figure 6:
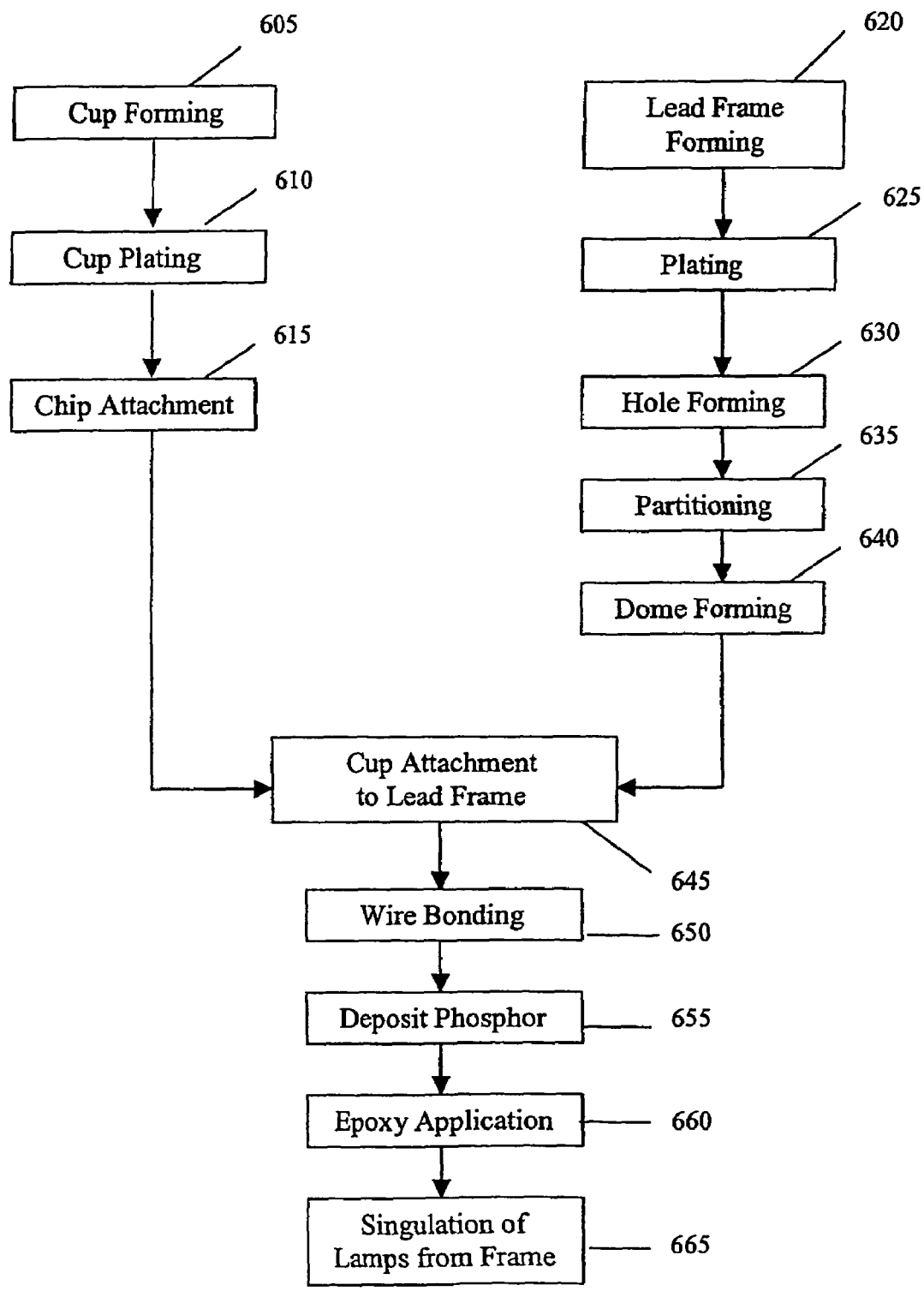
FIG. 6 is a process flow diagram of a method of producing a lamp according to an embodiment of the invention.
Figure 7:
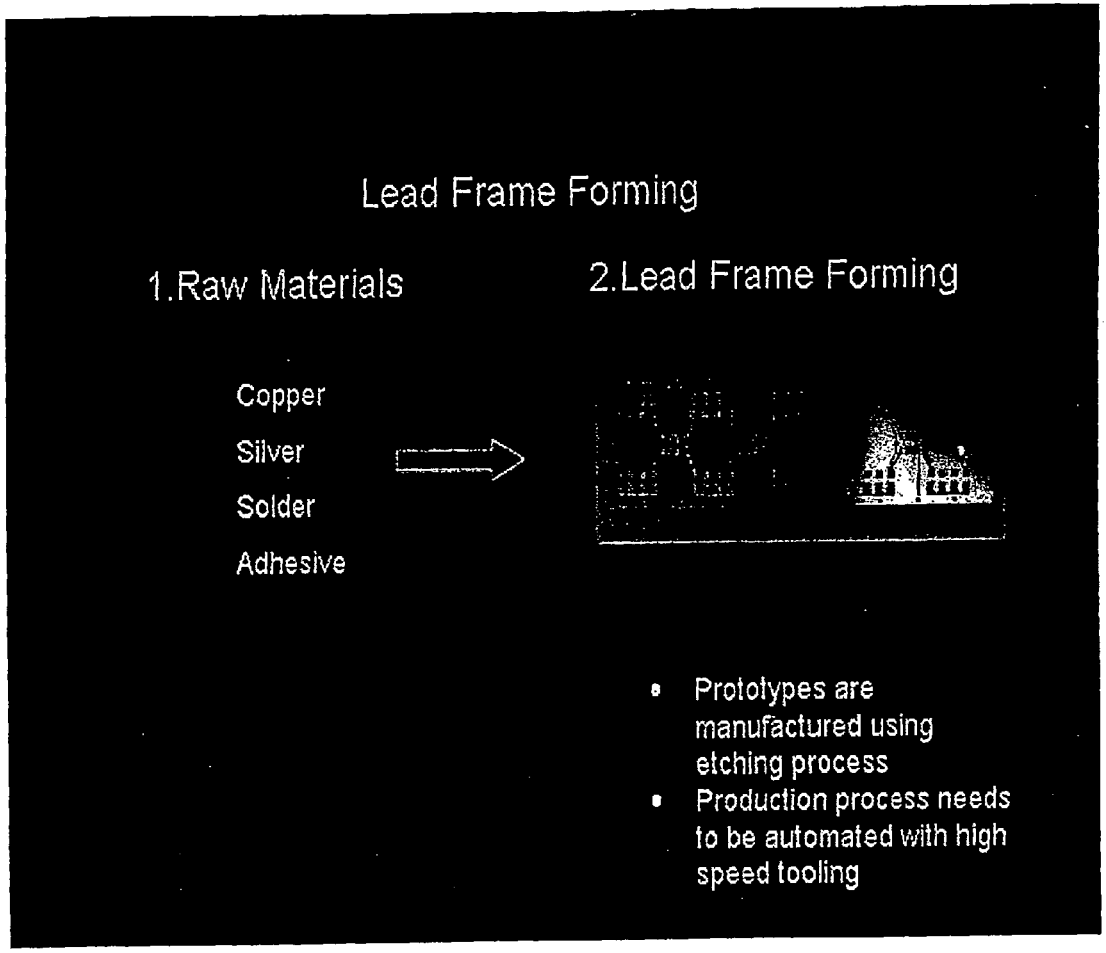
FIGS. 7 to 14 illustrate steps in the process of FIG. 6.
Figure 8:
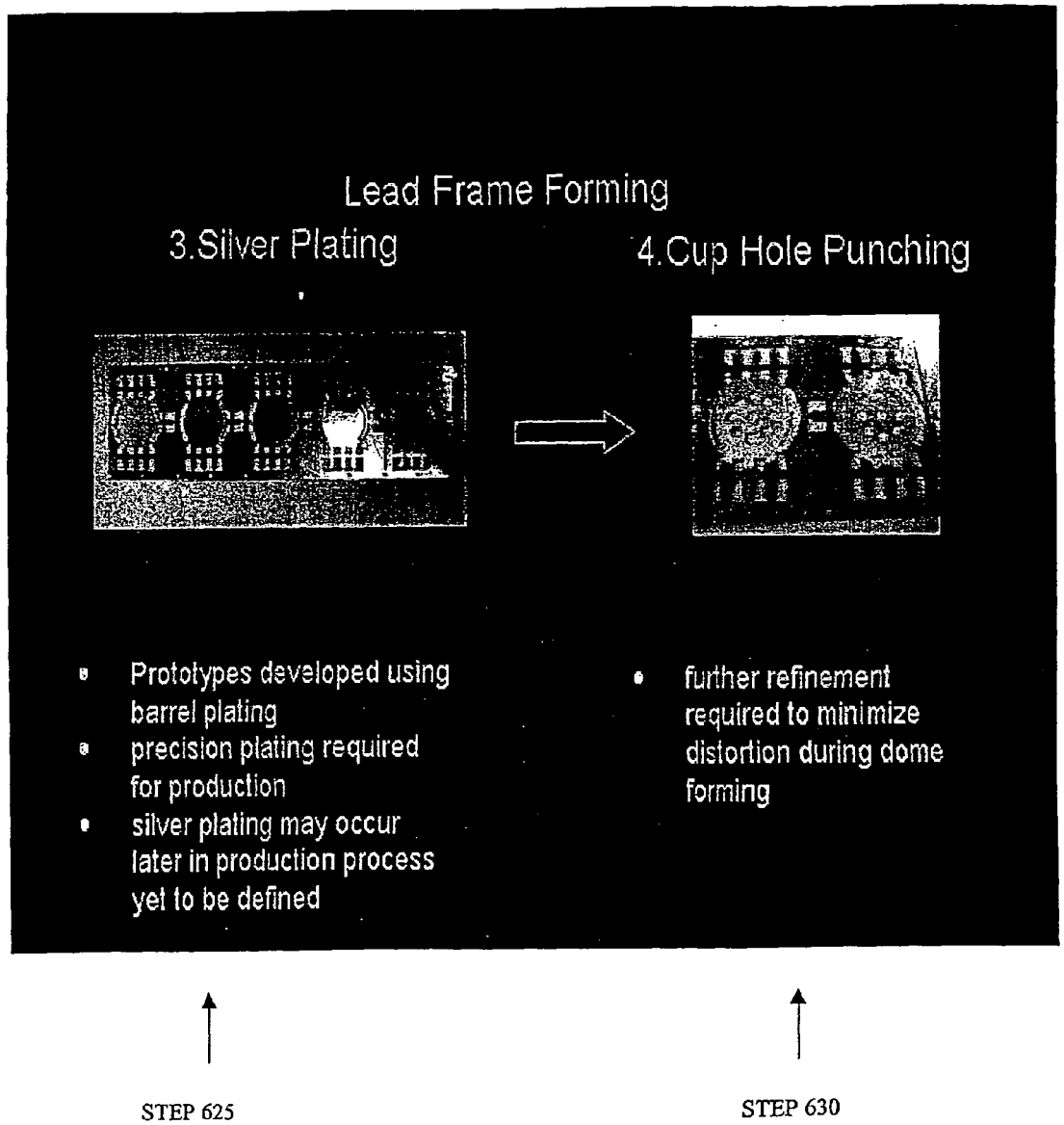
Figure 9:
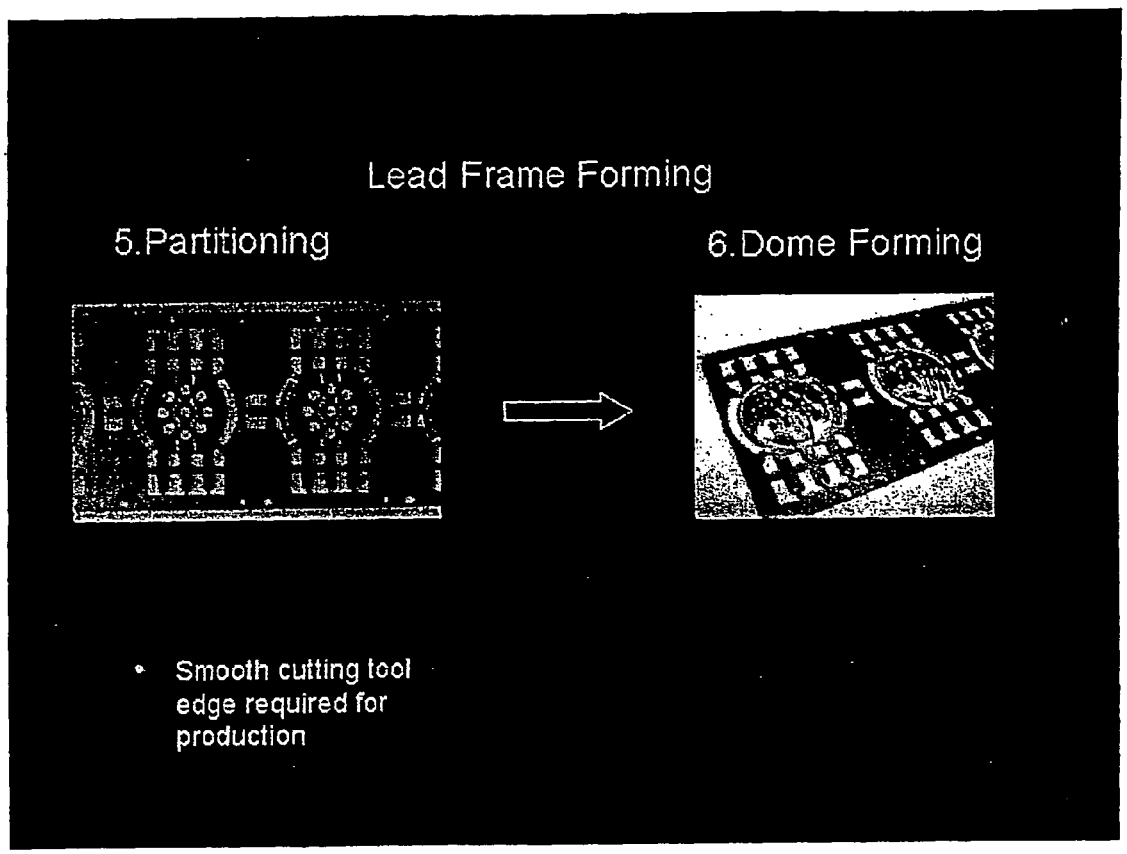
Figure 10:
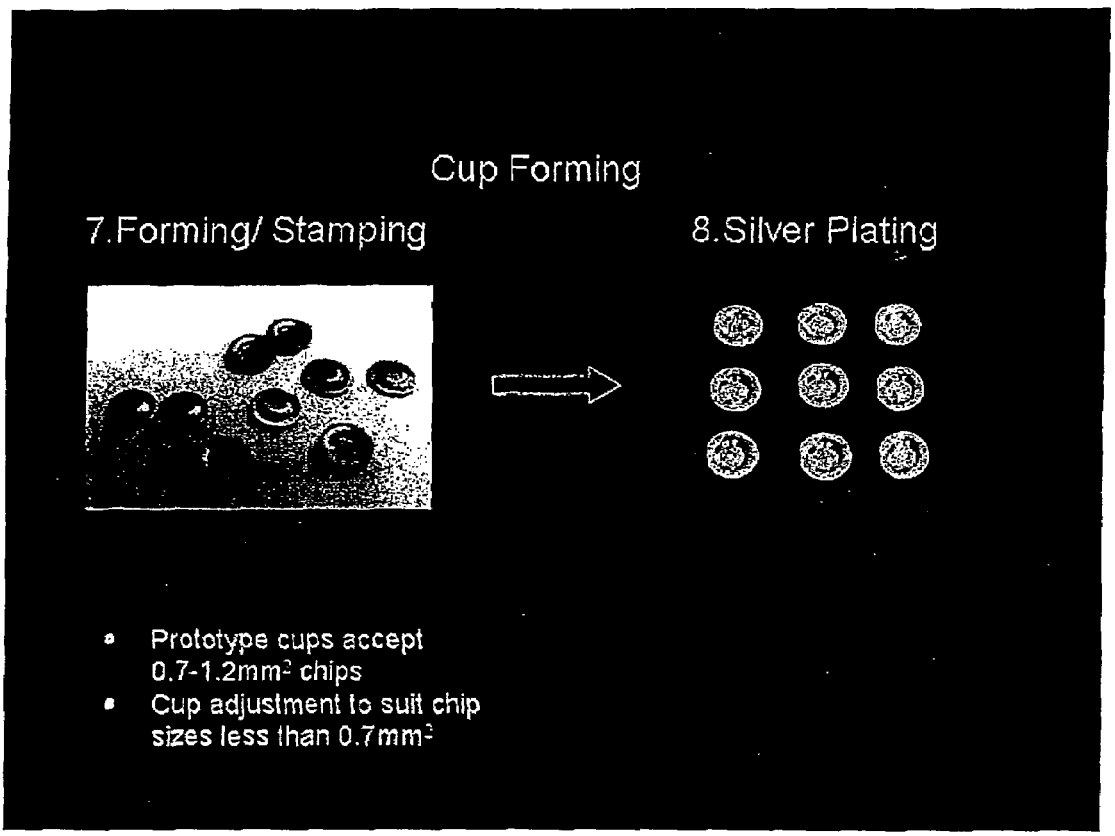
Figure 11:
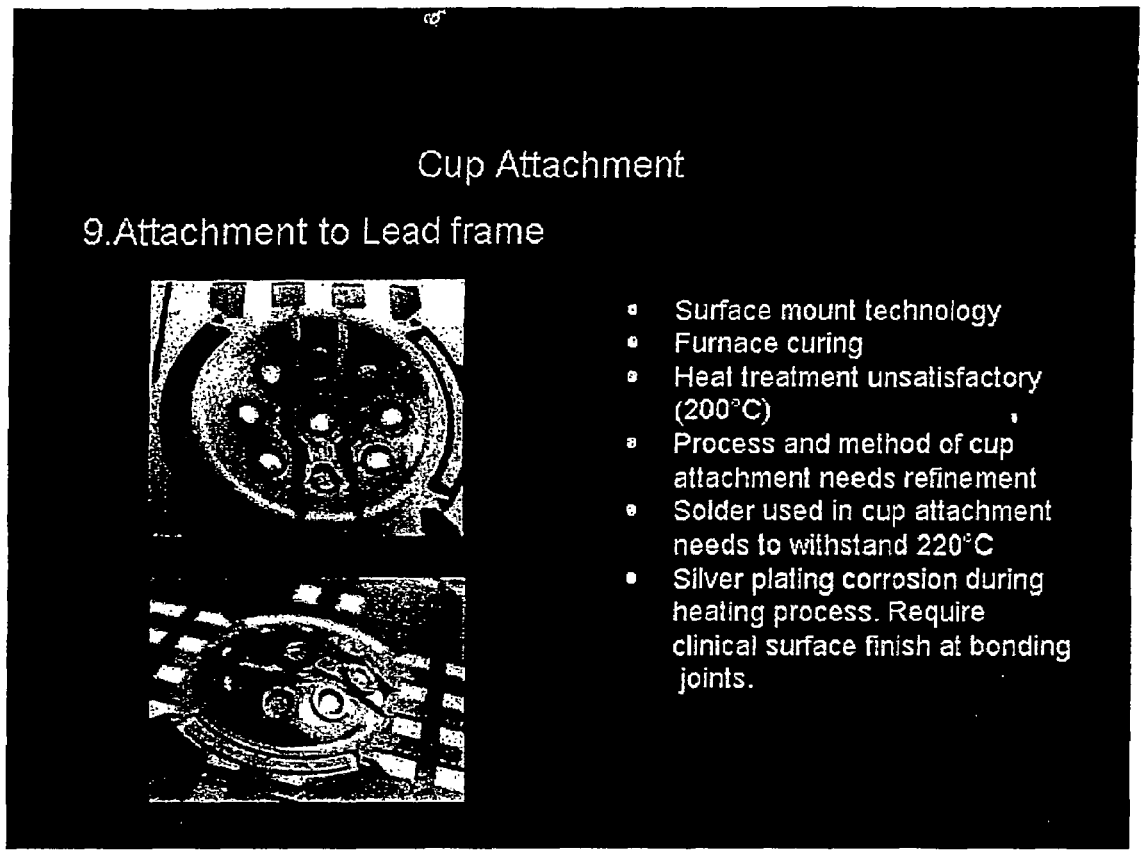
Figure 12:
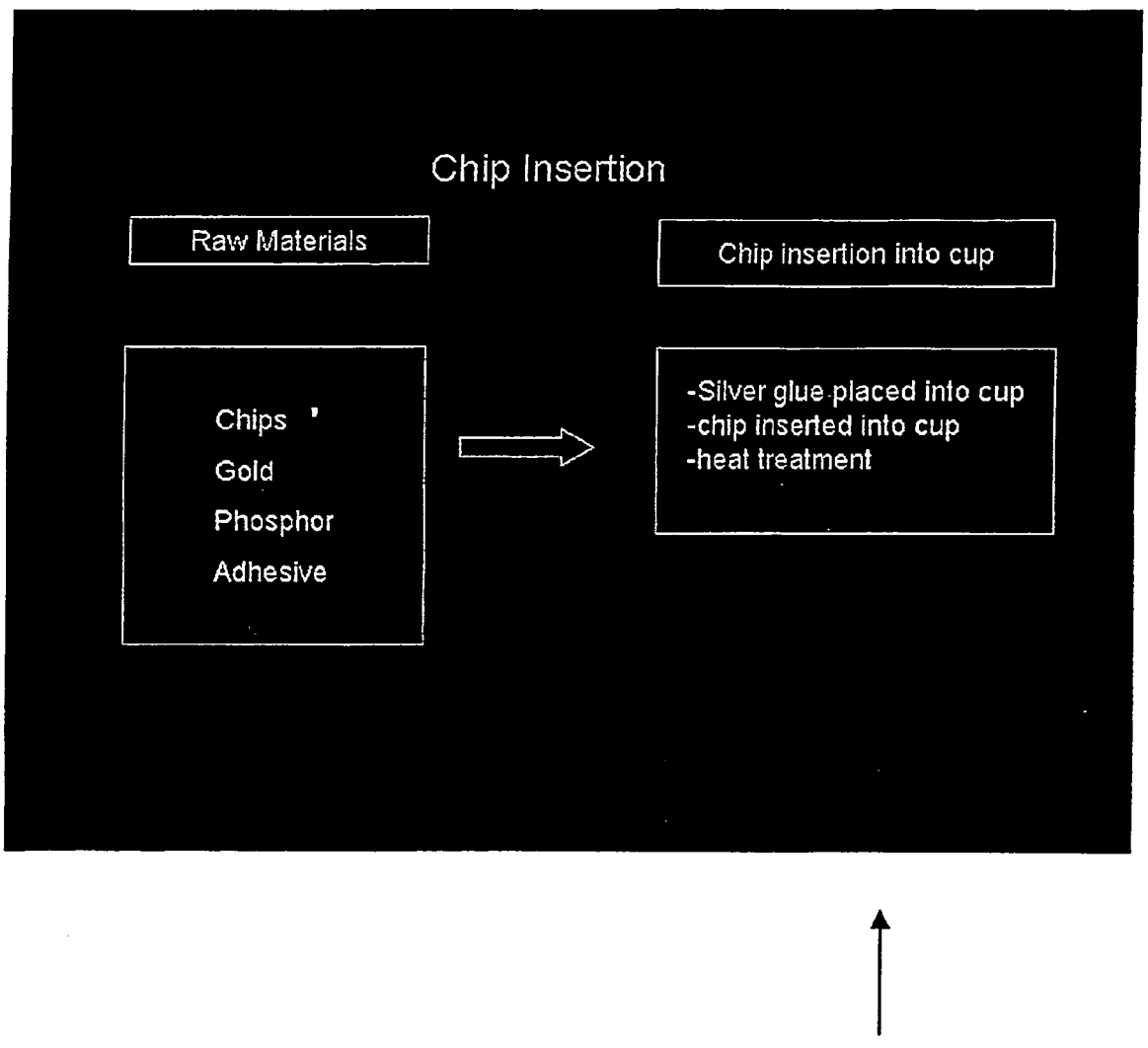
Figure 13:
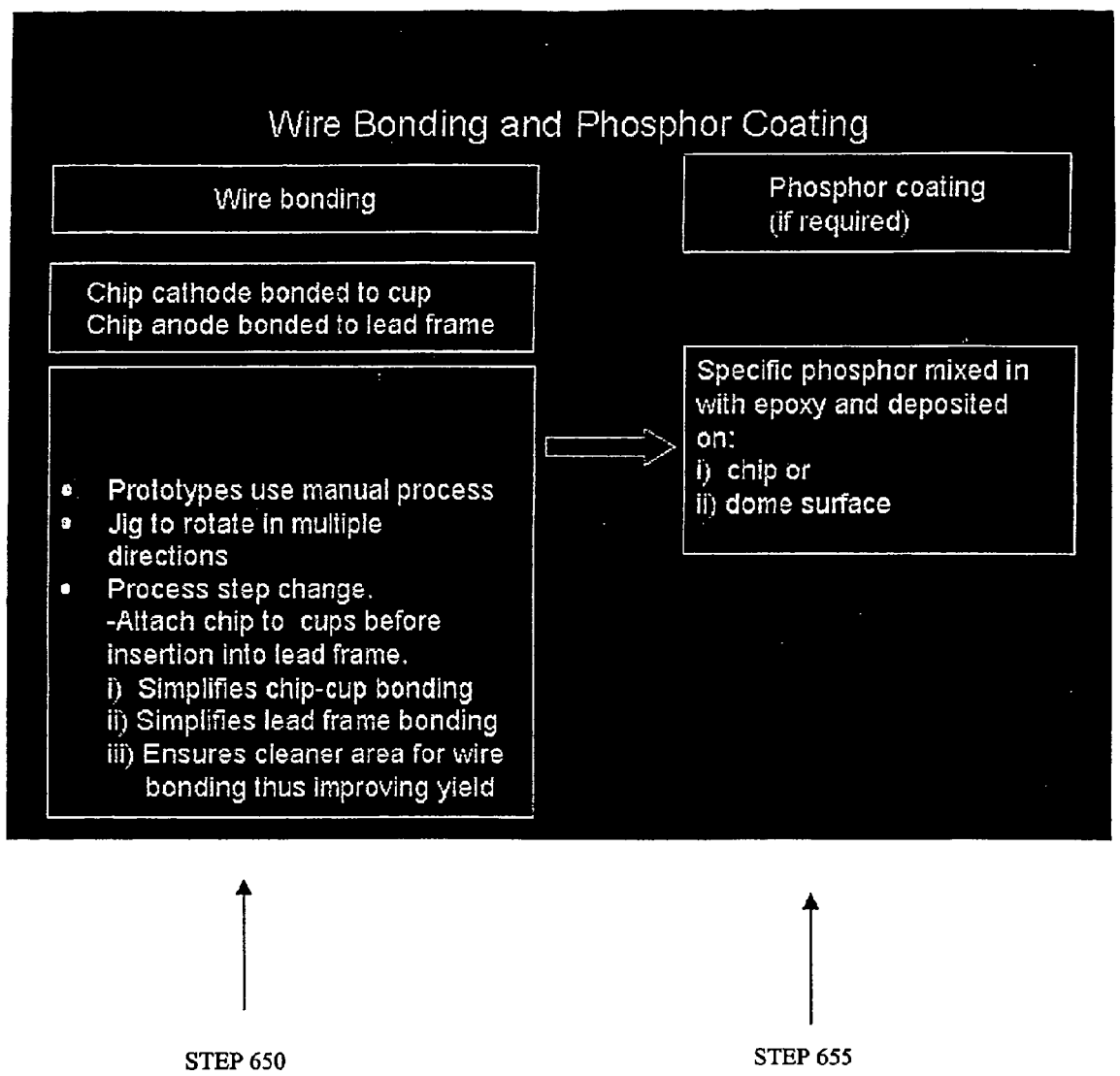
Figure 14:
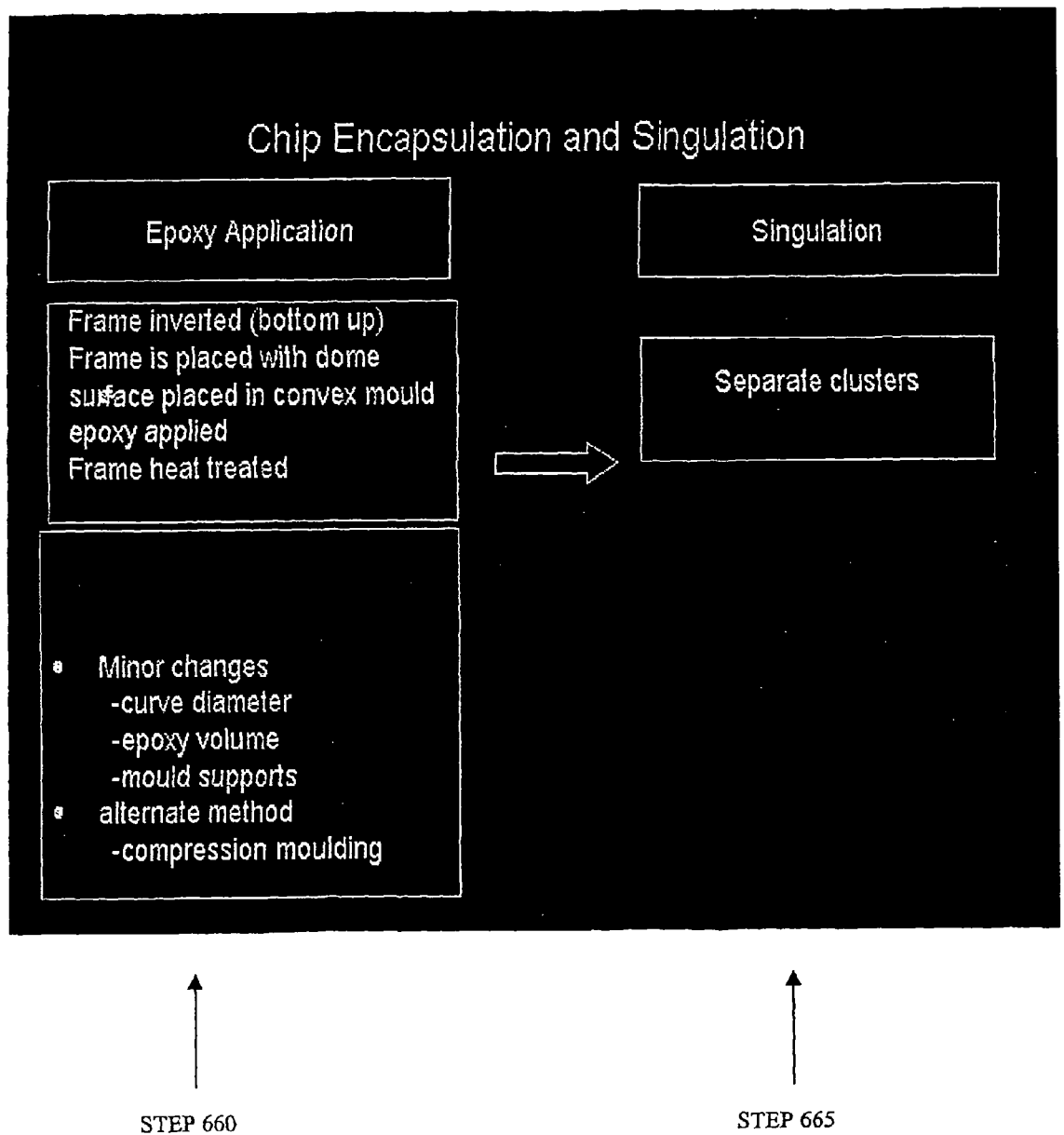

In an alternative form of lead frame to the convex domed shape shown in FIG. 2A, a concave form of the lead frame may be formed, such as that shown in FIG. 2B. Apart from the differences in orientation of curvature of the lead frame supporting structure, the concave lamp embodiment shown in FIG. 2B may be formed in a similar manner to that of FIG. 2A and other convex lamp embodiments shown in the drawings and described herein. In particular, the lamp production process as shown and described in relation to FIG. 6 is applicable to concave lead frame arrangements. For example, instead of forming a dome in the central portion of the lead frame at step 640, a bowl (inverted dome) may be formed. Such a concave form of the lead frame would involve more of a focussing of the light emitted from the junctions and thus such an embodiment would be more suitable for applications requiring a more focussed, rather than even, distribution of light. This lamp embodiment would thus have a focal length approximately equal to the radius of curvature C of the central curved portion of the lead frame. The effectiveness of the focus in this case will be partly determined by the magnitude of the radius of curvature C and will be influenced by the values of R r and T.

A lamp is formed by inserting singular cups, complete with dies, into holes 6 in the curved lead frame conductors 10, 11, 12 of the lead frame 110, as shown in FIG. 3A. In the shown embodiment, pairs of intermediate conductors 14, 15, 16 are attached by wire bonding between the active portion of the dies of a first polarity and conductors 10, 11, 12. In addition, pairs of intermediate conductors 17, 18, 19 are attached by wire bonding to the active portion of the dies of a second polarity and to a common supply conductor 13 and conductors 11 and 12, respectively. This configuration allows control of the current, and therefore control of the intensity of the emitted light, flowing through the groups of light emitting junctions mounted on conductors 10, 11, 12.

Figure 15:
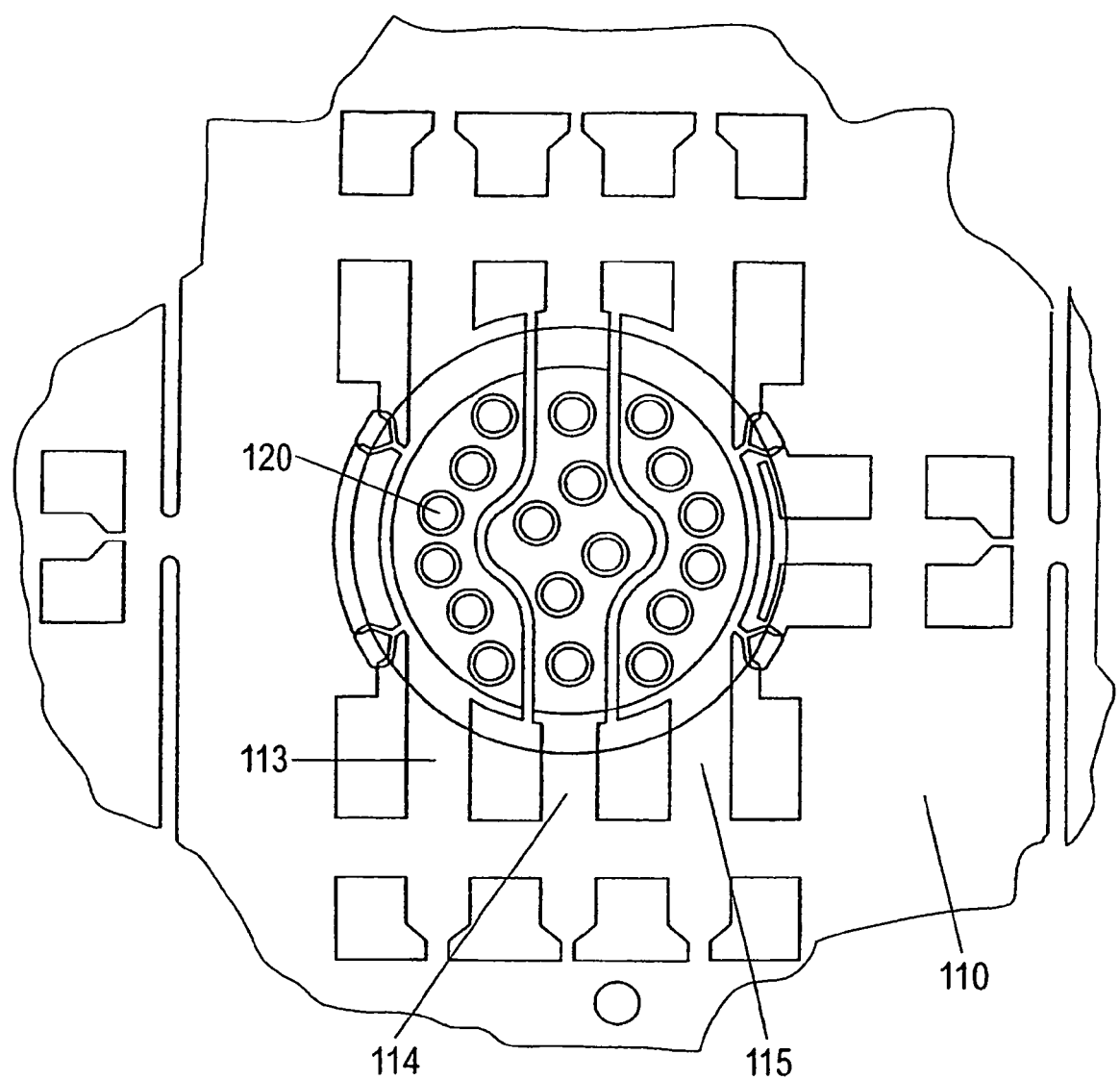
FIG. 15 illustrates an alternative form of lamp lead frame (prior to singulation) according to a further embodiment of the invention.

Apart from common supply conductor 13, only three curved lead frame conductors, 10, 11 and 12 are shown in FIG. 3A. It is specifically envisioned that a greater number of curved lead frame conductors may be employed, each supporting a number of cup assemblies. For example, while FIG. 15 shows an embodiment of the lead frame for supporting 18 junctions within respective cup assemblies distributed on three separate conductors 113, 114 and 115, this arrangement may be modified to provide five separate conductors supporting six cup assemblies in each. Further embodiments are contemplated, although not shown, in which a larger number of cup assemblies may be supported, for example in the order of 50 to 100.

Although the intermediate conductors 17, 18 and 19 shown in FIG. 3A are described as being in pairs, it may be appropriate to use single intermediate conductors instead, for example where small, low current junctions are employed in the cup assemblies 3.

The embodiment shown in FIGS. 3A and 3B is particularly suitable for large junctions which draw greater currents than smaller junctions and thus pairs of intermediate conductors are desirable for allowing for even collection and supply of current to the active regions of the die. The pairs of conductors also provide a second current path which serves to reduce possible losses associated with having only one intermediate conducting wire to and from the die.

In an alternative embodiment to that shown in FIGS. 3A and 3B, the pairs of intermediate conductors 14, 15 and 16 may be connected to the cup instead of to curved conductors 10, 11 and 12. In this alternative embodiment, each of the cups is in electrical connection with the curved conductors 10, 11 and 12 by virtue of being mounted thereon using a conductive material, such as solder or a silver glue. This alternative arrangement allows for the pairs of intermediate conductors 14, 15 and 16 to be attached to an interior wall of the cup 2 prior to mounting of the cup in the holes 6 of the curved conductors 10, 11 and 12. In other respects, this embodiment is similar to that shown and described above in relation to FIGS. 3A and 3B.

In a further alternative embodiment (described further below in relation to FIGS. 4A and 4B), instead of the intermediate conductors 14, 15 and 16 being connected to the interior wall of the cups, pairs of conductors 26 and 27 are connected between the cathode and anode of the die 4 and conductive regions 22 and 23, respectively. Further intermediate conductors are then used to connect between the curved conductors 10, 11 and 12 and the conductive regions 22 and 23.

Figure 17:
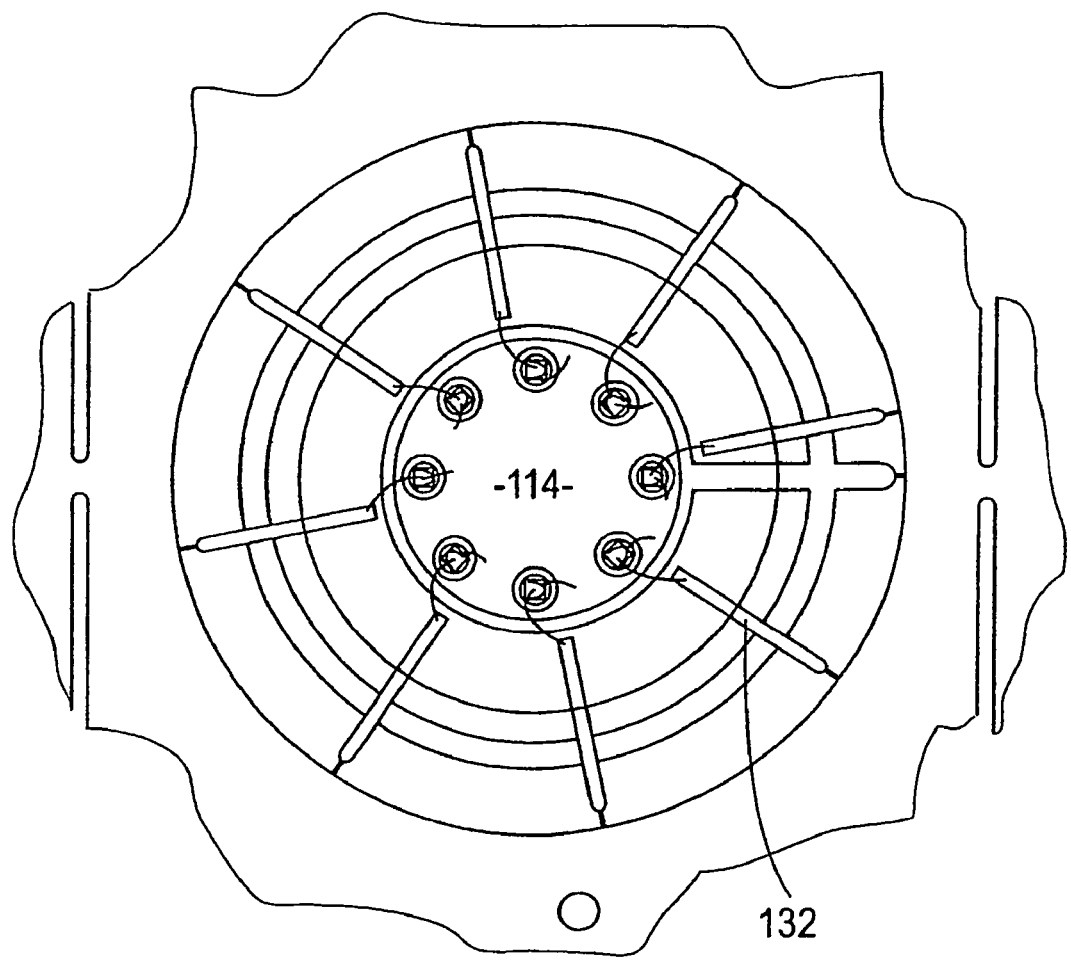
FIG. 17 is a plan view of a lamp according to a further embodiment.

In another embodiment (shown in FIG. 17), the current flowing through each individual light emitting junction can be controlled independently of all others by suitably arranging the connection of intermediate conductors. FIG. 17 shows a possible arrangement of 8 LEDs which can be individually and independently controlled. In this arrangement, the central curved (spherical) part of the lead frame is not partitioned into separate conductors, but is instead a common conductor 114 for all LEDs mounted on it. It is convenient for consistency to make this common conductor 114 the cathode (or negative terminal). There are eight anodes 132 shown, one for each die, through which the flow of current to each die can be controlled. The anodes 132 are arranged in the form of spokes about the central part of the lamp lead frame. It is convenient to make the cathode common because AlGaInP dies (Red and Amber) have the cathode on the underside of the die (which is electrically and physically connected to the cup), so when mounted on a conductor it must be the cathode for these dies, and since InGaN dies (Green and Blue) have an insulated underside it is convenient to standardize the connections with respect to polarity. This is the opposite polarity to the lead frames which have three groups of LEDs. Common is positive for these because the undersides of the chips (negative) may be electrically connected to respective ones of the three curved sections of the lead frame via the conductive cups in which they are disposed.

The light emitted by the LEDs is of a narrow frequency or wavelength bandwidth, which in the visible spectrum is perceived as a specific colour. LED's with red, yellow, green and blue light have become commonplace. If LEDs of different colours are arranged in a cluster such as that shown in FIG. 17, it becomes possible to generate light from LEDs which is perceived to be of a different colour to the characteristic colour of any of the constituent LEDs in the array. By controlling the excitation current in each LED, the level of light output may be controlled, which allows the light from the LEDs to be combined in variable proportions thereby generating different colours.

For example, red, green and blue lights can be combined in the correct proportions to give a generally white light appearance. Similarly, the lamp can be arranged to emit light of a single colour by passing current through only those LEDs which have the same wavelength, and to change colour by reducing the excitation to those LEDs of a first wavelength and simultaneously increasing the excitation to a group of LEDs of a second wavelength. A suitable control system can be devised to generate any combination of colour and intensity within the possibilities presented by the characteristics of the LED dies installed in the lamp.

Packaging the lamp in selected optically suitable material, such as epoxy resin, can further enhance the process of combining, or otherwise, the light emitted by the LED dies. If, for example, an epoxy or other encapsulating material is chosen which has low light absorption, minimum back scatter and superior diffusion properties then it may be possible to achieve an almost homogeneous single colour emission from the lamp and to vary the colour widely over the visible spectrum. This may be achieved even though some of the LEDs may be mounted near the extremities of the spherical part of the lamp and have generally divergent beams of light. In another arrangement, a package of optically clear low absorption material may be chosen for a function where combination of light into a single colour is of less importance.

The electronics industry has devised many ways of controlling LED arrays and displays. These are generally suitable for small power LEDs—in the order of 100 milliwatts of power per LED, where the current to be controlled is in the order of 20-50 milliamps.

LED dies with an area of one square millimeter (die size 1 mm×1 mm) require excitation current to be up to 350-500 milliamps. Developments in the industry are expected to deliver LED dies of 2.5 square millimeters and larger, which will require excitation currents in excess of 1000 milliamps. In general, LED controllers will be required to have a power handling capacity of 5 Watts per LED, compared to the present range at around 100 milliwatts per LED—an increase of 50 times.

The present invention encompasses, but is not restricted to, LED die sizes up to 1.26×1.26 mm which each consume 1 Watt of power. The control circuit driving such a lamp must be capable of controlling a number of such LEDs. For example, if 18 LEDs are mounted in the lamp, the control circuit will need to be able to drive an output in the order of 18 Watts.

Figure 4A:
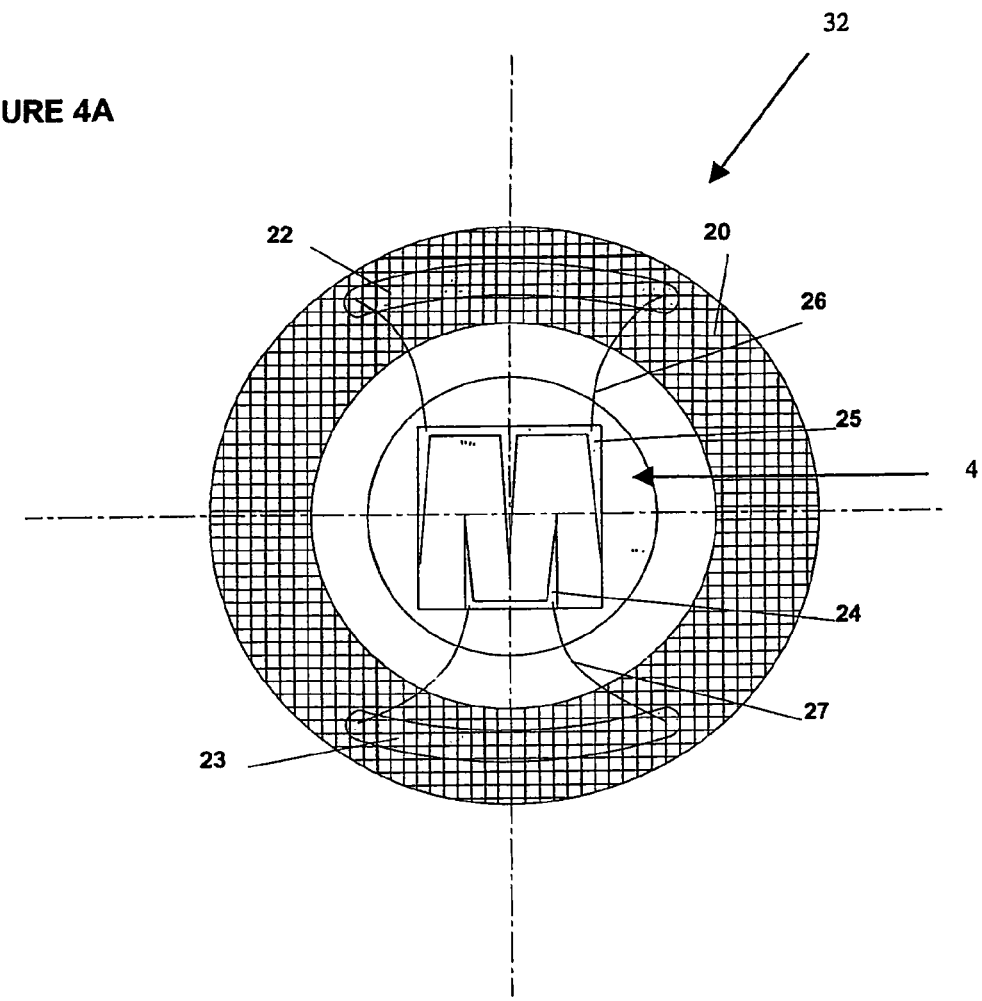
FIGS. 4A and 4B are plane and side cross-sectional views of an example of a cup assembly with a light emitting junction mounted therein.
Figure 4B:
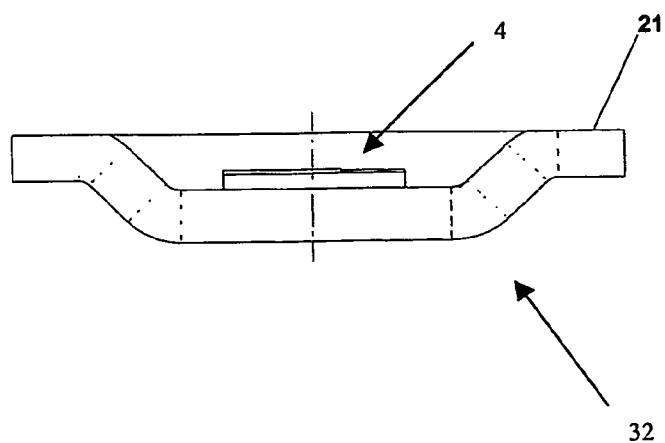
Figure 5:
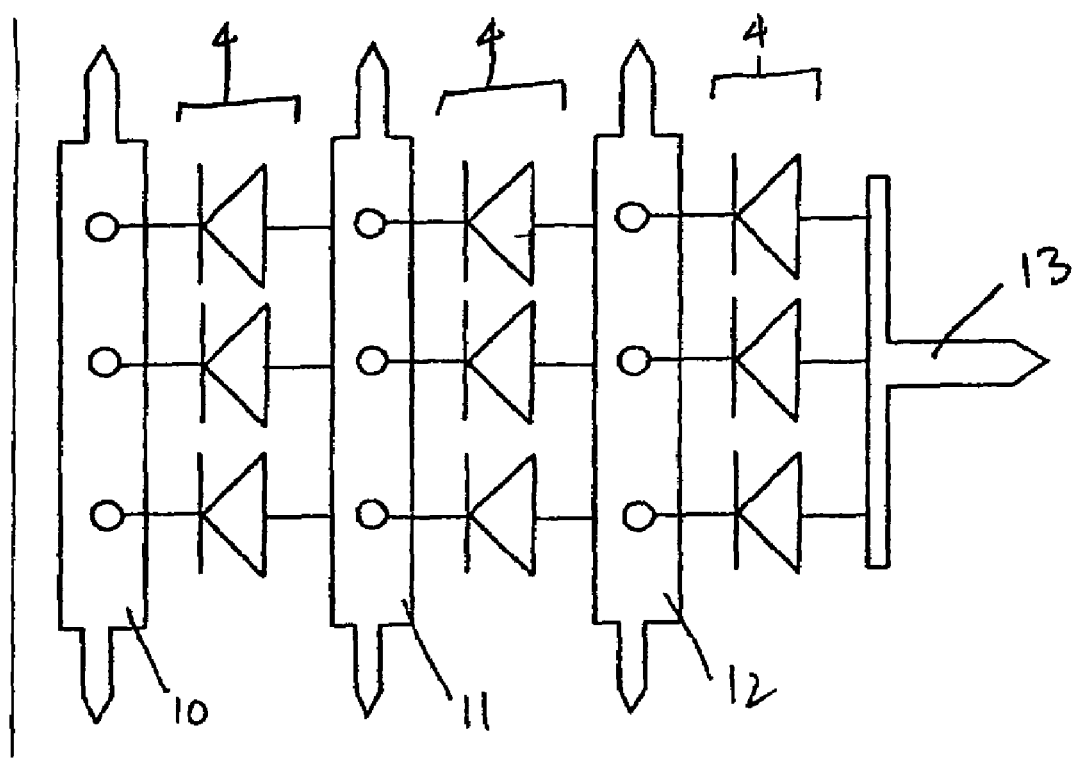
FIG. 5 is a schematic diagram illustrating electrical connections of a lamp of one embodiment of the invention.

In another preferred embodiment, illustrated by FIGS. 4A and 4B, alternative cups 32 are provided with a layer of electrical insulation 20, on an upper surface of cup flange 21, with areas of electrically conductive material 22 & 23 superimposed on the insulation. This allows the active areas of the die 24 & 25, to be connected by bonding wires 26 & 27, to the conductive areas 22 & 23. These connections can be made during the process of attaching the dies to the cups. It presents a considerable simplification to the process of wire bonding described above, in which the bonding equipment is required to accommodate the layout of a three dimensional array.

Simple conventional practices can be used to make the equivalent to intermediate connections 14 & 17 shown in FIG. 3A, if the bonding wires are attached to the cups when they are in a linear array. This embodiment further allows the use of packaged light emitting junctions in many other applications. Commonly used 'pick and place' machinery can be used to automatically install the cups and to make the connections.

Conductive regions 22 and 23 are preferably formed in a thin layer over a layer of insulation applied to the rim of each cup. The insulating material may be epoxy or some other compound which has good adhesion to the surface of the cup and gives a good electrical insulation in thin layer form. The conductive regions may be formed by metal deposition or other suitable process. Such processes are used to produce printed circuits, in particular metal cored printed circuits which are often manufactured on a metallic substrate of aluminium.

A cup assembly 3 or package (i.e. a cup with a junction mounted on it) has significant advantages over light emitting junctions available in other surface mounting packages. The limitation imposed by poor heat dissipation from conventional packages is largely overcome. A cup package can be easily installed directly into a prepared recess in a 'Metal Cored Printed Circuit Board' (MCPCB), thus having applications other than in lamp lighting. An almost ideal thermal path may thus be created, from the heat source (the die) through the cup material and directly into the highly dissipative core of an MCPCB.

Restrictions on the size of a die and the practical limit of power that a die can dissipate control the quantity of light currently available from these devices. By providing a method of effectively and conveniently dissipating heat losses in a die, practical restrictions on the size of dies which can be employed successfully are effectively removed. Thus, cups designed to accommodate dies which can consume several watts of power, and which produce light somewhat in proportion to the input power, can be produced simply and cheaply.

Examples of large LED dies which can be used in embodiments of the invention are listed on Table 1 below. For smaller LED dies, there are numerous varieties on the market and suitable dies would be apparent to skilled persons.

TABLE 1

| Colour | Wavelength | Forward Voltage | Part No | Manufacturer |
|--------|------------|-----------------|---------|--------------|
| Blue | 470 nm | 3.6-4.0 V | LE470-P2-G | AXT |
| Green | 525 nm | 3.6-4.0 | LE525-P2-G | AXT |
| Amber | 590 nm | 2.0-2.4 | ES-CAYL529 | Epistar |
| Red | 625 nm | 2.0-2.4 | ES-CAHR529 | Epistar |

Referring now to FIG. 6, a process flow diagram is shown, by which a lamp can be produced according to embodiments of the invention. The preferred lamp production process involves forming the cups separately, having junctions mounted therein, and mounting the cup assemblies onto the lead frame once the lead frame has been manufactured to a certain point (i.e. past step 640). Once the cups are attached to the lead frame, they are processed together to form the lamp at step 665.

At step 605, the cups are formed, for example by a pressing tool, from a copper plate or other suitable sheet or strip of deformable conductive material, and each of the cups is pressed from the plate or sheet so as to form the receptacles illustrated in FIGS. 1A to 1C. Step 605 includes forming the mark 7 on each cup. Once singulated from the material from which they were pressed, the cups are plated at step 610 with a silver, aluminium or other conductive material, for example by barrel plating, precision plating or vapor deposition, to achieve a plating thickness of about 4 to 8 microns. After plating, the dies (referred to as chips in FIG. 6) are attached to the inside base surface of the cup at step 615, preferably by a silver glue so that the junction faces outward away from the base surface. Once the junctions are attached at step 615 to the cups, the thus-formed cup assemblies may be packaged into a linear strip or a two-dimensional sheet which can be fed into a robotic pick and place machine, for example, such as those used in surface mount technology.

Independently of cup formation, lead frame processing begins at step 620 by machining the basic shape of the lead frame. The machining may be by etching or mechanical stamping and it is preferred that the lead frame be formed of copper or copper alloy sheet material in the order of about 400 microns thickness. The thickness of the lead frame material is preferably chosen for optimum thermal conduction of excess heat away from the cup assemblies. For example, if larger dies are installed in the cup assemblies there will be more heat generated than if smaller dies are used. Increasing the thickness of the lead frame will assist in conducting this heat away from the lamp. The basic shape of the lead frame formed at step 620 includes conductors 10, 11, 12 and 13 within a surrounding supporting frame of copper sheet material prior to being spherically deformed and separated into separate conductors. At step 625, a center conductive portion (which becomes conductors 10, 11, 12 and 13) of each lead frame is plated, preferably with silver or aluminium, to a thickness of about 4 to 8 microns. The plating is applied at least over the central portion of the lead frame which will receive the cups and be in electrical contact therewith, but may be applied over the whole upper surface of the lead frame for economy or convenience. Once the plating has been completed, holes are punched into the central (plated) portion of the lead frame, at step 630. These holes will form the holes 6 shown in FIG. 2 for receiving the cups after the spherical shape has been applied to the central portion of the lead frame. Next, at step 635, the conductors 10, 11 and 12 are partitioned (conductor 13 is preferably already partitioned as part of step 620) so as to separate groups of holes from each other in the central portion of the lead frame. This partitioning is preferably performed using a smooth and precise cutting tool so that no additional processing is required to finish the edges created between the conductors during partitioning.

The partitioning is performed according to the desired grouping of the holes in the central conductive portion of the lead frame. Accordingly, this grouping will depend on the number of holes formed in that portion during step 630. In a preferred embodiment, nine holes are formed at step 630. In alternative embodiments, for example such as that shown in FIG. 15, a different number of holes may be formed in the lead frame for receiving cups with junctions therein. The alternative embodiment shown in FIG. 15 has eighteen holes 120 formed in the central portion of the lead frame 110, with those holes grouped into three separate groups of six on conductors 113, 114 and 115. The partitioning step 635 must also take account of the deformation of the material of the lead frame during the subsequent dome forming step 640. For example, the holes formed in conductor 11 have a tendency to deform (elongate to become somewhat elliptical) slightly along with the deformation of the plated lead frame material during the spherical dome forming. Accordingly, the hole forming and partitioning steps 630 and 635 may be performed so as to compensate for deformation of the material during dome forming, for example by forming the holes on conductor 11 in a flattened elliptical form so that they stretch out to a more circular form during the dome forming step.

It is preferred that the dome forming step 640 be performed by some kind of press tool so as to provide a generally part-spherical shape to the central portion of the lead frame.

At step 645, cup assemblies 3 formed through steps 605 to 615 are attached to the lead frame following the dome forming step 640. This attachment is preferably performed by soldering, welding or using a conductive adhesive once the cup assemblies are placed in the holes 6 by, for example, precision robotic machinery.

After the cup assemblies are placed into the holes and fixed thereto, wire bonding is performed at step 650 so as to electrically connect the junctions in the cups to the conductors 10, 11, 12 and 13, as previously described. For this wire bonding, gold wire is preferably employed using known heat/sonic welding techniques, the wire having a diameter in the order of 25 to 50 microns. Other forms of bonding techniques using different wire material and wire diameters are common in the industry, and may alternatively be employed.

After the wire bonding, a phosphor is optionally applied over the top of individual junctions at step 655. This is done by evenly mixing a phosphor powder into an epoxy and dispensing the epoxy in drops onto the top light emitting surface of each junction. At step 660, an optically clear epoxy resin or thermoplastic is applied to the central part of the lead frame so as to encase it. If no phosphor was deposited over the individual junctions at step 655, a phosphor powder may be mixed in with the epoxy encasing the central part of the lead frame at step 660. In order to apply the epoxy or thermoplastic, the lead frame is inverted and placed into a mould of a complementary part-spherical shape. Once the epoxy resin or thermoplastic has cured or otherwise set, the lead frames are then processed, at step 665, so as to singulate them from each other, including punching the conductors 10, 11, 12 and 13 free of those parts of the lead frame which held them in place prior to the epoxy application. It is also at this step that webs (evident from the drawings) connecting the conductors 10, 11 and 12 are removed, for example by punching, thus electrically isolating those conductors from each other.

FIGS. 7 to 14 illustrate the above described process steps and, in conjunction with Table 2 below, serve to illustrate a production process in accordance with a preferred embodiment. Table 2 below summarises some of the processing steps described above and preferred methods and materials for these steps.

TABLE 2

| Item | Process | Method | Material Generic | Material e.g. |
|---|---|---|---|---|
| Lead Frame | Machine Basic Shape | a) Etching, or b) Mechanical stamping | Copper Strip | Copper Alloy A194 HH Nominal Thickness 15 mil.(381 Microns) |
|  | Plating | a) Barrel Plating b) Precision Plating c) Vapour Deposition | Silver or Aluminium | 4 to 8 Microns |
|  | Cup hole formation | Press Tool | — |  |
|  | Partitioning | Press Tool | — |  |
|  | Dome formation | Press Tool | — |  |
| Cups | Machine Basic Shape | Press Tool | — |  |
|  | Plating | Barrel plating Precision Plating Vapour Deposition | Silver or Aluminium | 4 to 8 Microns |
|  | Cup Attachment | Soldering, or Conductive Glueing | Lead/tin alloy or paste Silver glue | 70/30 Lead/Tin CMI 121-03 |
| Chip Insertion | Apply adhesive | Dispenser | Silver Glue | CMI 121-03 |
|  | Chip Placement | Robotic | LED chip | InGaN, AlInGaP |
|  | Heat Treatment | Process oven | — |  |
| Wire Bonding | Electrical connections | Heat/Sonic Welder | Gold Wire | 25-50 Microns Diam. |
| Optional | Apply Phosphor | Dispenser | Phosphor Powder | Hung Ta 80911 465 ~470 nM, or 11001 471~474 nM |
|  |  |  | Optically Clear Epoxy | Epifine T-6000A2 & T-6000B |

TABLE 2-continued

| Item | Process | Method | Material Generic | Material e.g. |
|---|---|---|---|---|
| Packaging | Moulded Epoxy, or | Mould, Process Oven | Optically Clear Epoxy Resin & catalyst | Epifine T-6000A2 T-6000B |
|  | Compression Moulding | Moulding Machine | Optically Clear Thermoplastic | Degussa Plexiglas df21 8N |
| Finish | Singulation | Press Tool | — |  |

FIG. 15 shows an alternative form of lead frame 110 having a higher number of holes 120 disposed in the central portion thereof. Conductors 113, 114 and 115 each support six cup assemblies and are arranged so as to generally provide an even distribution of light from the junctions when the lamp is in operation. The precise configuration and location of the groups of holes on conductors 113, 114 and 115 may be varied as required, in order to achieve a desired light output pattern. The number and positioning of the holes 120 may also be varied, depending on practical manufacturing requirements.

Figure 16:
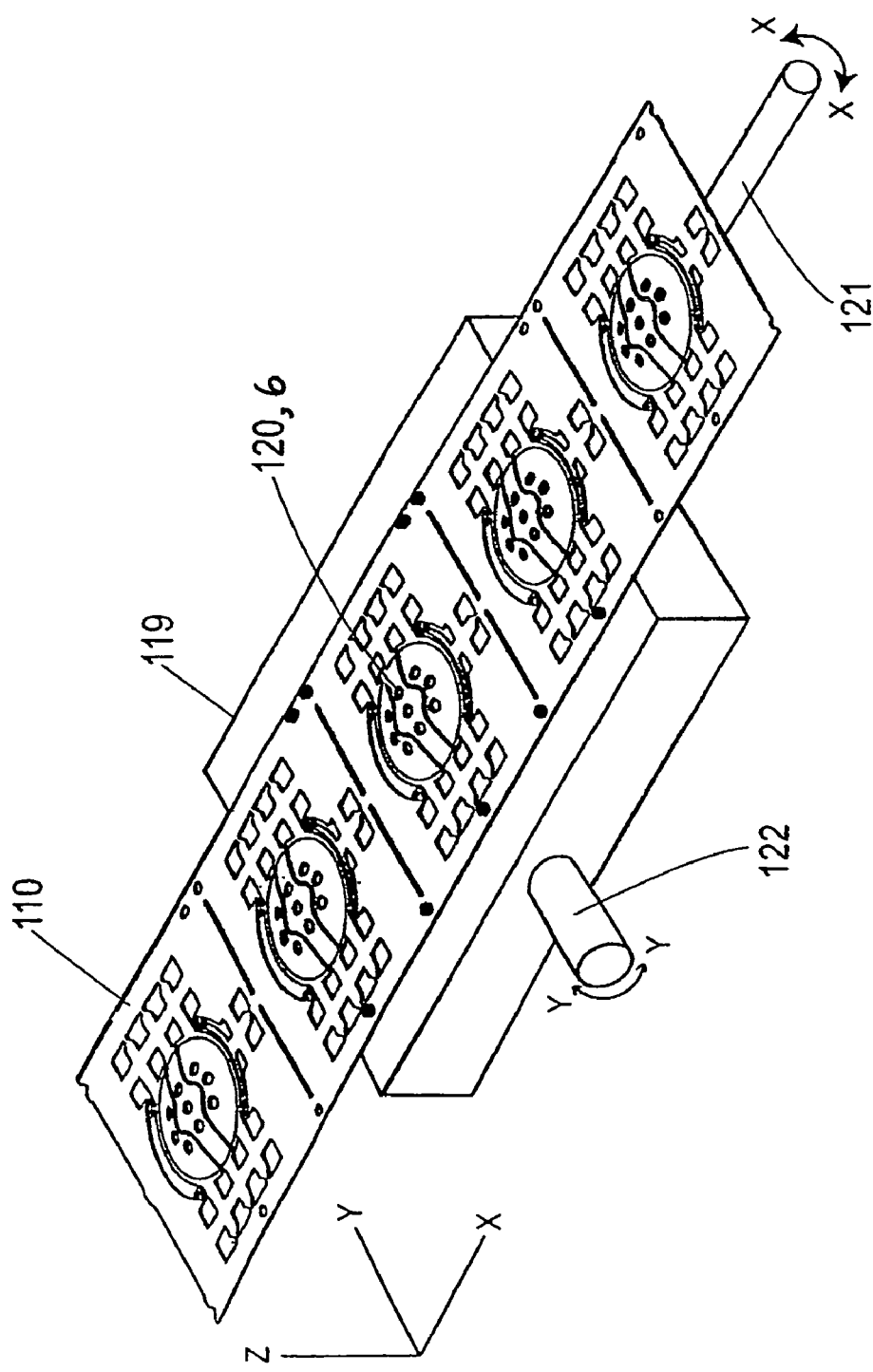
FIG. 16 illustrates a part of a lamp production process according to one embodiment.

FIG. 16 illustrates a part of the lamp production process, generally corresponding to step 645 of FIG. 6, where the cup assemblies are placed into holes 6 or 120 in the lead frame 110. The lead frames 110 are processed across a carrier 119 in sequence so that the cup assemblies 3 may be placed in recesses 120 (holes 6). The carrier 119 may be constructed to mate with the part spherical surface, and the reference markers, of the lead frame. This mating part may be either a raised convex face which is complimentary to the concave underside of the convex lead frame, or alternatively be a concave recess which is complimentary to the convex underside of the concave lead frame. Convex and concave lamp profiles such as those illustrated by FIG. 2A and FIG. 2B may thus be constructed by utilising alternate profiles on the carrier. The carrier 119 may be rotatable on a shaft 121, for pivotable movement about an X axis, and a shaft 122, for pivotable movement about a Y axis. In this way, the lead frame 110 can be positioned at a mounting station (not shown) and rotated about the X or Y axis relative to the mounting station so as to facilitate placement of the cup assemblies 3 in the recesses. Alternatively, if a suitable robotics mechanism is available, the carrier 119 is fixed in place and the robotic placement machinery can place the cup assemblies 3 into the respective recesses, accounting for the part-spherical shape of the central portion of the lead frame. In such an embodiment, reference markers are provided along the outer edges on the lead frame 110 for positional calibration by the robotics machinery.

Certain modifications or enhancements to the embodiments herein before described will be apparent to those skilled in the art without departing from the spirit and scope of the present invention.

What is claimed is:

1. A method of producing a lamp, including:
    forming, from an electrically conductive material, a plurality of electrically conductive receptacles;
    forming, from an electrically conductive material, an electrically conductive non-planar support structure divided into mutually spaced portions, the portions having a three-dimensional array of recesses or through holes therein, the recesses or through holes being configured to receive and support the electrically conductive receptacles;
    mounting light emitting junctions in the electrically conductive receptacles;
    mounting the electrically conductive receptacles with light emitting junctions mounted therein in respective ones of the recesses or through holes in the mutually spaced portions of the non-planar electrically conductive support structure so as to form a three-dimensional array of electrically conductive receptacles in electrical connection with the mutually spaced portions of the non-planar electrically conductive support structure, each of the electrically conductive receptacles being supported by a corresponding one of the mutually spaced portions of the non-planar electrically conductive support structure; and
    forming electrical connections between the light emitting junctions and the mutually spaced portions of the non-planar electrically conductive support structure;
    wherein each of the light emitting junctions includes two electrical contacts of opposite electrical polarities, one of the electrical contacts being directly electrically connected to the portion of the electrically conductive support structure that supports the light emitting junction, and the other of the electrical contacts being directly electrically connected to another of the portions of the electrically conductive support structure so that electrical current flows through the supporting portions of the non-planar electrically conductive support structure to supply power to the light emitting junctions.

2. A method as claimed in claim 1, wherein each of the receptacles is asymmetrical, the light emitting junctions being mounted in the electrically conductive receptacles in a selected orientation relative to the asymmetry to facilitate the formation of electrical connections to electrical contacts of the light emitting junctions.

3. A method as claimed in claim 1, including forming electrical connections between the junctions mounted in the receptacles and the receptacles prior to the receptacles being mounted on the electrically conductive support structure.

4. A method as claimed in claim 3, wherein each of the receptacles includes an electrically conductive body and at least one electrically conductive contact attached to, but electrically insulated from, the body of the receptacle.

5. A method as claimed in claim 4, wherein said forming of electrical connections between the junctions mounted in the receptacles and the receptacles includes forming electrical connections between the junctions and the electrically conductive contacts attached to, but electrically insulated from, the bodies of the receptacles.

6. A method as claimed in claim 5, wherein said forming of electrical connections between the junctions mounted in the receptacles and the receptacles includes forming electrical connections between the junctions mounted in the receptacles and the bodies of the receptacles.

7. A method as claimed in claim 6, wherein each of the receptacle bodies includes a generally concave portion having a planar base to which corresponding light emitting junctions are mounted, and a flange to which the corresponding at least one electrically conductive contact is mounted, an electrical insulator being disposed between the flange and the at least one electrically conductive contact.

8. A method as claimed in claim 7, wherein each receptacle is supported on the electrically conductive support structure by its flange.

9. A method as claimed in claim 6, wherein the step of forming electrical connections between the light emitting junctions and the electrically conductive support structure includes forming electrical connections between the electrically conductive support structure and the electrically conductive contacts attached to, but electrically insulated from, the bodies of the receptacles.

10. A method as claimed in claim 1, wherein the mutually spaced portions of the support structure are curved.

11. A method as claimed in claim 10, wherein the curved portions of the support structure are collectively dome-shaped.

12. A method as claimed in claim 10, wherein the curved portions of the support structure are collectively substantially part spherical.

13. A method as claimed in claim 10, wherein the curved portions of the support structure collectively have a concave bowl-like shape.

14. A method as claimed in claim 10, wherein each of portions of the support structure is curved, one of said curved portions of the support structure being two-dimensionally curved and the rest of said curved portions of the support structure being three-dimensionally curved.

15. A method as claimed in claim 14, wherein each junction is electrically connected to two of the curved portions of the support structure.

16. A method as claimed in claim 10, wherein the electrical connections between the junctions and the portions of the support structure are configured such that the current flowing in at least one group of junctions can be controlled separately to the current flowing in at least one other group of junctions.

17. A method as claimed in claim 10, wherein the electrical connections between the junctions and the portions of the support structure are configured such that the current flowing in any junction can be controlled independently of the current in every other junction.

18. A method as claimed in claim 1, wherein the receptacles are shaped like cups or bowls.

19. A method as claimed in claim 1, wherein the receptacles have reflective sidewalls that determine the illumination provided by the lamps.

20. A method as claimed in claim 1, wherein the receptacles are mounted in respective recesses in the support structure.

21. A method as claimed in claim 1, wherein the receptacles are mounted in respective through holes extending through the support structure.

22. A method as claimed in claim 1, wherein the junctions mounted in the receptacles are electrically connected to electrically conductive areas electrically insulated from, but mounted on, a flange of each receptacle.

23. A method as claimed in claim 1, wherein the receptacles are formed in a one-dimensional or two-dimensional array and are subsequently singularized.

24. A method as claimed in claim 23, wherein singularized receptacles, with light emitting junctions attached, are packaged in tape and reel, or other, bulk packaging.

25. A method as claimed in claim 1, wherein the support structure is formed as a lead frame.

26. A method as claimed in claim 25, wherein the support structure is formed by:
    stamping an electrically conductive plate in a predetermined configuration;
    forming recesses or through holes in a portion of the electrically conductive plate for receiving said receptacles;
    dividing at least the portion of the electrically conductive plate to form the mutually spaced portions; and
    impressing a curved configuration on said portion.

27. A method as claimed in claim 26, wherein the portion is coated with silver or silver alloy.

28. A method as claimed in claim 26, wherein the curved configuration impressed on said portion is a dome shape.

29. A method as claimed in claim 28, wherein the electrically conductive support structure is substantially dome-shaped.

30. A method as claimed in claim 28, wherein the dome shape is substantially part-spherical.

31. A method as claimed in claim 1, wherein the electrically conductive receptacles and the electrically conductive support structure are configured to effectively dissipate heat generated by the light emitting junctions.

32. A lamp formed in accordance with the method of claim 1.

33. A lamp including:
    a plurality of electrically conductive receptacles;
    an electrically conductive non-planar support structure divided into mutually spaced portions, the portions having a three-dimensional array of recesses or through holes therein, the recesses or through holes being configured to receive and support the electrically conductive receptacles;
    wherein the electrically conductive receptacles are mounted in respective ones of the recesses or through holes in the mutually spaced portions of the non-planar support structure so as to form a three-dimensional array of electrically conductive receptacles in electrical connection with the mutually spaced portions of the electrically conductive support structure, each of the electrically conductive receptacles being supported by a corresponding one of the mutually spaced portions of the non-planar electrically conductive support structure;
    light emitting junctions disposed in respective ones of said electrically conductive receptacles and electrically connected to the mutually spaced portions of the electrically conductive support structure; and
    electrical connections between the light emitting junctions and the mutually spaced portions of the non-planar electrically conductive support structure;
    wherein each of the light emitting junctions includes two electrical contacts of opposite electrical polarities, one of the electrical contacts being directly electrically connected to the portion of the electrically conductive support structure that supports the light emitting junction, and the other of the electrical contacts being directly electrically connected to another of the portions of the electrically conductive support structure so that electrical current flows through the supporting portions of the non-planar electrically conductive support structure to supply power to the light emitting junctions.

34. A lamp as claimed in claim 33, wherein each of the receptacles is asymmetrical, the light emitting junctions being mounted in the electrically conductive receptacles in a common orientation relative to the asymmetry.

35. A lamp as claimed in claim 33, wherein each junction mounted in a receptacle is electrically connected to that receptacle by at least one electrical conductor.

36. A lamp as claimed in claim 33, wherein each of the receptacles includes an electrically conductive body to which a corresponding light emitting junction is mounted, and at least one electrically conductive contact attached to, but electrically insulated from, the body of the receptacle, the lamp including first electrical connections between the junctions mounted in the receptacles and the electrically conductive contacts, and second electrical connections between the electrically conductive contacts and the electrically conductive support structure.

37. A lamp as claimed in claim 36, wherein each receptacle includes electrically conductive contacts attached to, but electrically insulated from, the body of the receptacle, said electrically conductive contacts of the receptacle being electrically connected to contacts of opposite polarities of the light emitting junction mounted in the receptacle.

38. A lamp as claimed in claim 36, wherein each light emitting junction includes two electrically conductive contacts of opposite polarities respectively connected to the corresponding receptacle body and to an electrically conductive contact attached to, but electrically insulated from, the body of the corresponding receptacle.

39. A lamp as claimed in claim 36, wherein each receptacle body includes a generally concave portion having a planar base to which a corresponding light emitting junction is mounted, and a flange to which the corresponding at least one electrically conductive contact is mounted, an electrical insulator being disposed between the flange and the at least one electrically conductive contact.

40. A lamp as claimed in claim 39, wherein each receptacle is supported on the electrically conductive support structure by its flange.

41. A lamp as claimed in claim 33, wherein each receptacle is shaped like a cup or bowl.

42. A lamp as claimed in claim 33, wherein each receptacle has side walls arranged to direct light output from the junction, the cup further serving to dissipate heat generated from the junction, which is thermally coupled thereto.

43. A lamp as claimed in claim 33, wherein each receptacle further includes an electrically insulating layer, upon which is provided an electrically conductive area, to allow for electrical connection between a bonding wire of the light emitting junction mounted in the receptacle and an intermediate connection for coupling the junction to a conductor, for establishing a current through the light emitting junction.

44. A lamp as claimed in claim 33, wherein each receptacle is formed with a polarity indicator toward one side thereof for indicating the polarity of the junction disposed therein.

45. A lamp as claimed in claim 33, wherein the mutually spaced portions of the non-planar electrically conductive support structure are curved.

46. A lamp as claimed in claim 33, wherein one or more of the junctions is adapted to emit light of a different color to the other junctions.

47. A lamp as claimed in claim 45, wherein the other of the electrical contacts of each light emitting junction is directly electrically connected to the another of the portions of the electrically conductive support structure by an intermediate conductor.

48. A lamp as claimed in claim 45, wherein each of the mutually spaced portions of the non-planar electrically conductive support structure is curved, one of said curved portions being two-dimensionally curved and the rest of said curved portions being three-dimensionally curved.

49. A lamp as claimed in claim 48, wherein each junction is electrically connected to two of the curved portions.

50. A lamp as claimed in claim 33, wherein the junctions are electrically connected to the mutually spaced portions of the non-planar electrically conductive support structure such that the current flowing in at least one group of junctions can be controlled separately to the current flowing in at least one other group of junctions.

51. A lamp as claimed in claim 33, wherein the junctions are connected to the mutually spaced portions of the non-planar electrically conductive support structure such that the current flowing in any junction can be controlled independently of the current in every other junction.

52. A lamp as claimed in claim 33, wherein the receptacles are mounted in respective recesses in the support structure.

53. A lamp as claimed in claim 33, wherein the receptacles are mounted in respective through holes extending through the support structure.

54. A lamp as claimed in claim 45, wherein at least some of the mutually spaced portions are formed in a part spherical configuration.

55. A lamp as claimed in claim 54, wherein at least some of the mutually spaced portions are formed in a convex configuration.

56. A lamp as claimed in claim 54, wherein at least some of the mutually spaced portions are formed in a concave configuration.

57. A lamp as claimed in claim 33, wherein the support structure is formed as a lead frame.

58. A lamp as claimed in claim 57, wherein the lead frame is formed of copper or copper alloy.

59. A lamp as claimed in claim 57, wherein at least a part of the lead frame is coated with silver or silver alloy.

60. A lamp as claimed in claim 33, wherein the receptacles are formed of copper or copper alloy.

61. A lamp as claimed in claim 60, wherein the receptacles are coated with silver or silver alloy.

62. A lamp as claimed in claim 33, wherein the mutually spaced portions of the electrically conductive support structure are collectively substantially dome shaped.

63. A lamp as claimed in claim 33, wherein the mutually spaced portions of the electrically conductive support structure are collectively substantially part-spherical.

64. A lamp as claimed in claim 33, wherein the electrically conductive receptacles and the electrically conductive support structure are configured to effectively dissipate heat generated by the light emitting junctions.

65. A lead frame for receiving a plurality of light emitting junctions to form a lamp, including:
  a dome-shaped, electrically conductive support structure divided into mutually spaced portions;
  a three-dimensional array of recesses or through holes in the mutually spaced portions of said electrically conductive support structure for receiving and supporting electrically conductive receptacles having light emitting junctions disposed therein to form a corresponding three-dimensional array of electrically conductive receptacles in electrical connection with the electrically conductive support structure.

* * * * *